(12) United States Patent
Inoue et al.

(10) Patent No.: US 7,851,883 B2
(45) Date of Patent: Dec. 14, 2010

(54) SEMICONDUCTOR DEVICE AND METHOD OF MANUFACTURE THEREOF

(75) Inventors: Masaki Inoue, Kusatsu (JP); Akira Ohdaira, Takatsuki (JP)

(73) Assignee: Panasonic Corporation, Osaka (JP)

( * ) Notice: Subject to any disclaimer, the term of this patent is extended or adjusted under 35 U.S.C. 154(b) by 434 days.

(21) Appl. No.: 11/075,895

(22) Filed: Mar. 10, 2005

(65) Prior Publication Data
US 2005/0253201 A1 Nov. 17, 2005

(30) Foreign Application Priority Data
May 14, 2004 (JP) .............................. 2004-145584

(51) Int. Cl.
*H01L 23/58* (2006.01)
(52) U.S. Cl. .................. 257/493; 257/335; 257/336; 257/337; 257/338; 257/339; 257/340; 257/341; 257/342; 257/343; 257/491; 257/492; 257/E29.024
(58) Field of Classification Search ............. 257/335, 257/336, 337, 338, 339, 340, 341, 342, 343, 257/491, 492, 493, E29.024
See application file for complete search history.

(56) References Cited

U.S. PATENT DOCUMENTS

| 5,406,104 | A | | 4/1995 | Hirota et al. | |
|---|---|---|---|---|---|
| 5,719,421 | A | * | 2/1998 | Hutter et al. | 257/335 |
| 6,194,760 | B1 | * | 2/2001 | Lee | 257/328 |
| 6,462,378 | B1 | * | 10/2002 | Kim | 257/342 |
| 2002/0195654 | A1 | * | 12/2002 | Kwon | 257/329 |
| 2004/0084744 | A1 | * | 5/2004 | Khemka et al. | 257/492 |
| 2004/0238913 | A1 | * | 12/2004 | Kwon et al. | 257/492 |

FOREIGN PATENT DOCUMENTS

| JP | 62-217664 | 9/1987 |
|---|---|---|
| JP | 4-199748 | 7/1992 |
| JP | 5-19077 | 1/1993 |
| JP | 3372773 | 11/2002 |
| JP | 2003-303961 | 10/2003 |

OTHER PUBLICATIONS

Japanese Office Action issued Dec. 22, 2009 in Japanese Patent Application No. 2004-145584.

* cited by examiner

*Primary Examiner*—Lynne A Gurley
*Assistant Examiner*—Samuel A Gebremariam
(74) *Attorney, Agent, or Firm*—Wenderoth, Lind & Ponack, L.L.P.

(57) ABSTRACT

This invention aims at providing an inexpensive semiconductor device having a parasitic diode and lowering an hfe of a parasitic PNP transistor and a manufacturing method thereof. Such semiconductor device includes a P-type silicon substrate and a gate electrode formed above the P-type silicon substrate. The P-type silicon substrate includes an N-type well layer, an N-type buried layer, a P-type body layer, an N-type source layer formed in the P-type body layer, and a drain contact layer formed in the N-type well layer. The P-type body layer and the N-type source layer are formed by self alignment that uses the gate electrode as a mask. The N-type drain contact layer is formed opposite the N-type source layer across the P-type body layer formed below the gate electrode. The N-type buried layer is formed below the P-type body layer.

18 Claims, 16 Drawing Sheets

FIG. 1    - PRIOR ART -
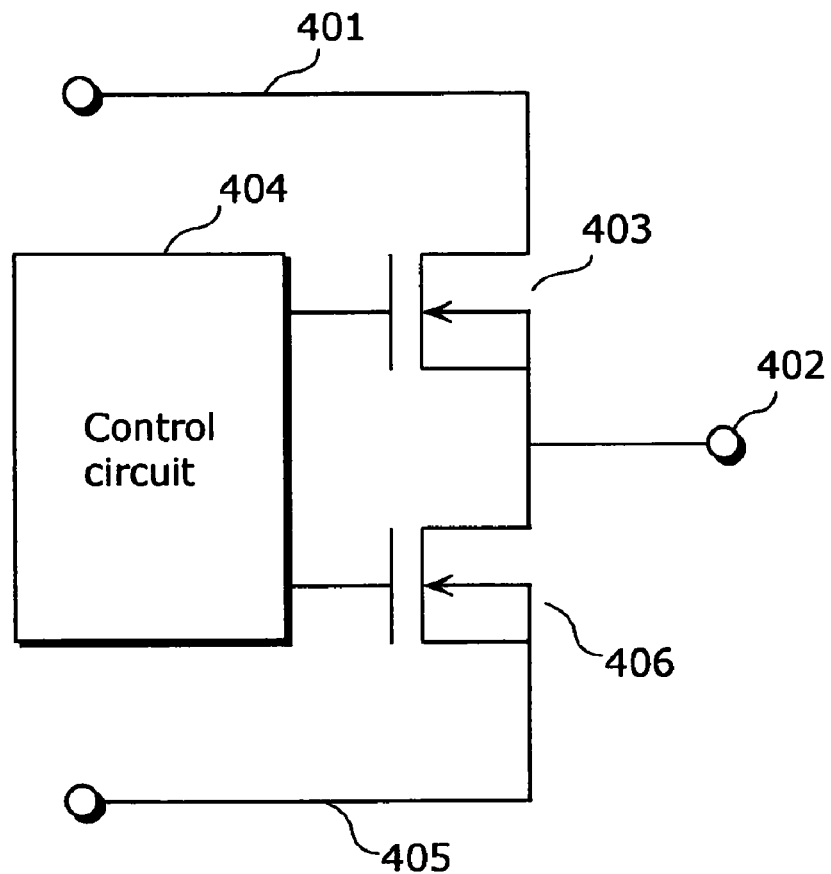
FIG. 2A    - PRIOR ART -
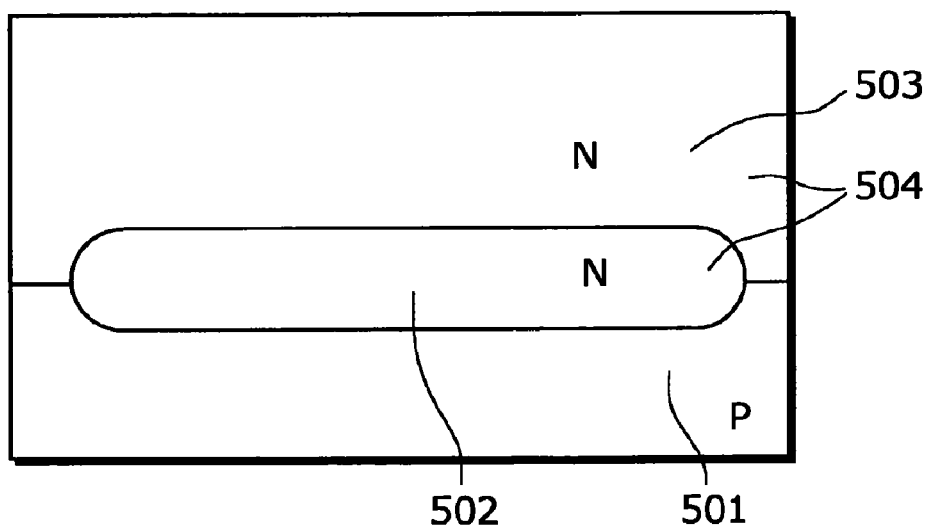

FIG. 2B - PRIOR ART -
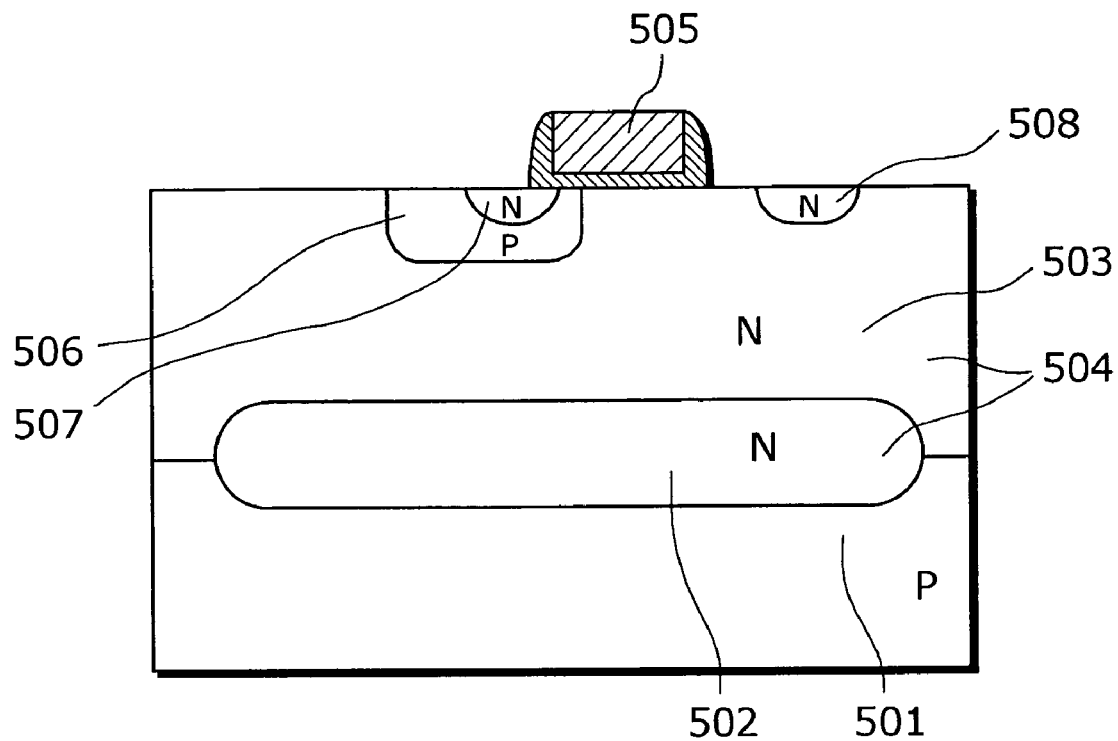
FIG. 2C - PRIOR ART -
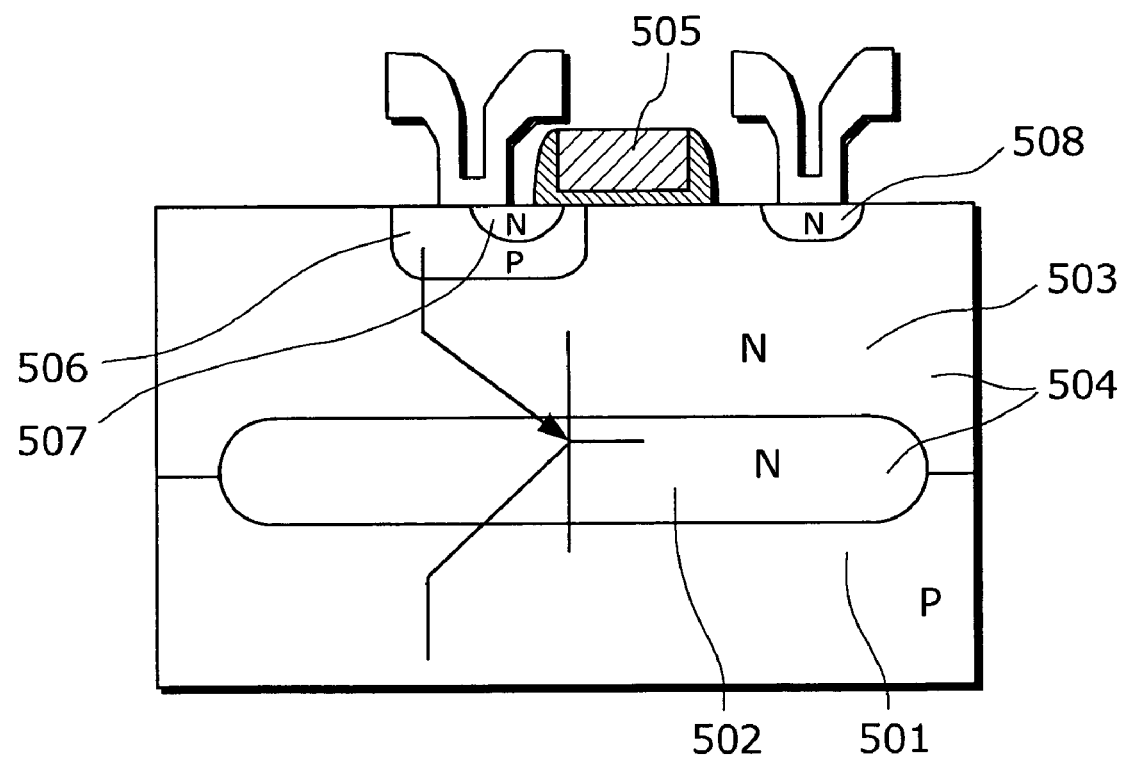

FIG. 3 - PRIOR ART -
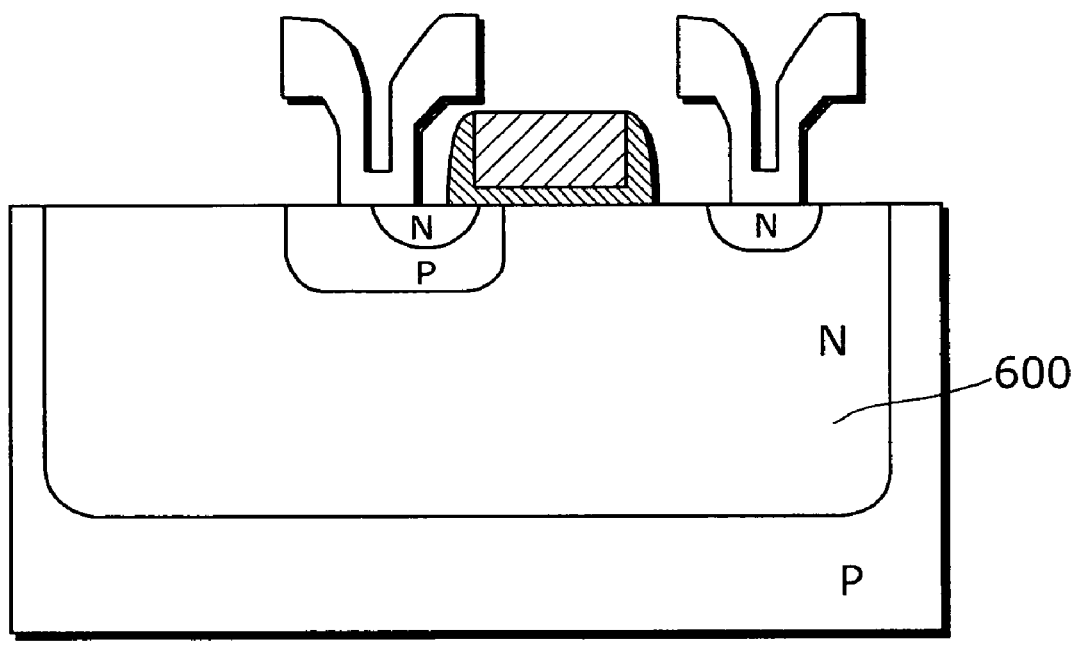
FIG. 4 - PRIOR ART -
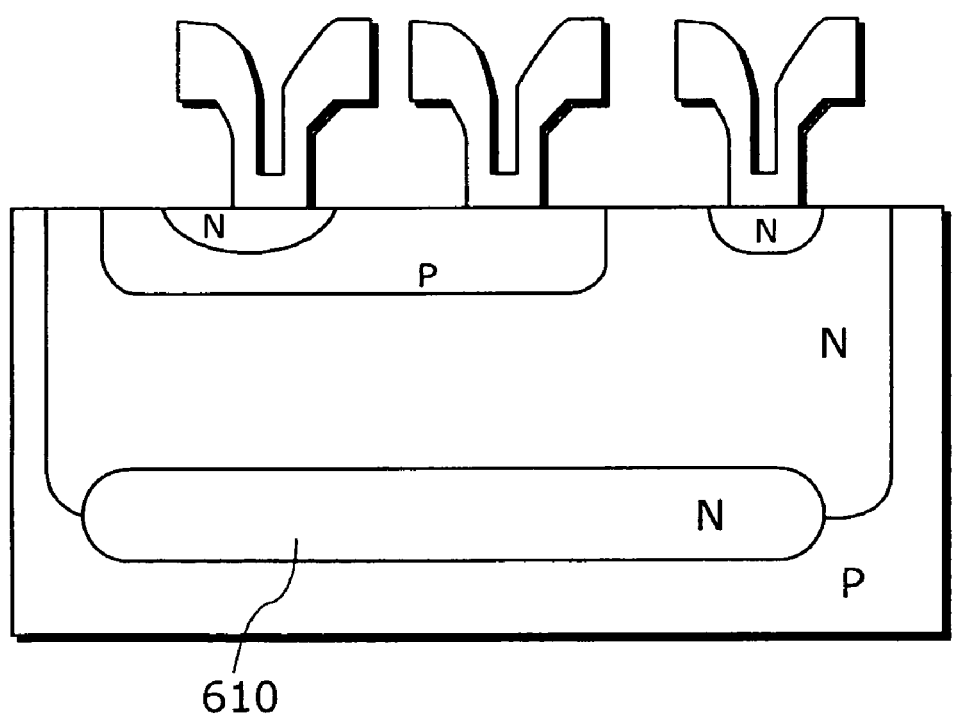

P channel MOS

SEMICONDUCTOR DEVICE AND METHOD OF MANUFACTURE THEREOF

BACKGROUND OF THE INVENTION (1) Field of the Invention

The present invention relates to a semiconductor device and a method of manufacture thereof, and particularly to a double diffused metal oxide semiconductor (DMOS) transistor that is inexpensive and that consumes a small mount of power.

(2) Description of the Related Art

Along with a decrease in power consumption as well as in cost of motor driver circuits, recent years have seen an increasing use of a technology that employs, as a semiconductor device of a motor driver circuits, a lateral DMOS transistor (hereinafter referred to as "DMOS transistor(s)") being a power device.

DMOS transistors, which have high-breakdown voltage and can therefore reduce on-resistance, are widely used as a transistor of an output circuit or the like of a motor driver circuit since they are optimum transistors as power devices. FIG. 1 is a circuit diagram showing an example output circuit of a motor driver circuit.

As shown in FIG. 1, an output circuit is comprised of: a first DMOS transistor 403 that is placed between a power line 401 and an output terminal 402; a second DMOS transistor 406 that is placed between the output terminal 402 and a ground line 405; and a control circuit 404 that controls on/off of the first DMOS transistor 403 and second DMOS transistor 406, being connected to gates thereof. In this case, a drain of the first DMOS transistor 403 is connected to the power line 401, and a source and body of the first DMOS transistor 403 are connected to the output terminal 402. Meanwhile, a drain of the second DMOS transistor 406 is connected to the output terminal 402, and a source and body of the second DMOS transistor 406 are connected to the ground line 405.

In order to drive a motor (not illustrated in this figure) that is connected to the output terminal 402, the output circuit with the above structure passes a current for driving the motor to the output terminal 402, by alternately turning on the first DMOS transistor 403 and the second DMOS transistor 406. Meanwhile, in order to stop the motor, the output circuit passes, to the power line 401, a regenerative current that has come from the output terminal 402 by turning off the first DMOS transistor 403 and second DMOS transistor 406, and by operating a parasitic diode of the first DMOS transistor 403 to minimize power consumption. When this is done, the regenerative current does not flow into the ground line 405.

FIGS. 2A to 2C are cross-sectional diagrams for explaining a method of manufacturing the first DMOS transistor 403/second DMOS transistor 406.

First, as shown in FIG. 2A, an N-type buried layer 502 and an N-type epitaxial layer 503 are sequentially formed on a P-type silicon substrate 501. When this is done, the N-type buried layer 502 is formed so that its concentration is higher than that of the N-type epitaxial layer 503. Such N-type buried layer 502 and N-type epitaxial layer 503 serve as a drain 504 of the DMOS transistor.

Next, as shown in FIG. 2B, a gate electrode 505 made of a gate oxide film and polysilicon is formed on the N-type epitaxial layer 503, after which a P-type body layer 506 is formed in the N-type epitaxial layer 503 by self alignment that uses the gate electrode 505 as a mask, and then an N-type source layer 507 is formed in such P-type body layer 506. Then, an N-type drain contact layer 508 is formed on a portion, in the N-type epitaxial layer 503, that is distant from the gate electrode 505. Here, a parasitic diode is formed by the P-type body layer 506 and the N-type epitaxial layer 503.

Next, as shown in FIG. 2C, the P-type body layer 506 and the N-type source layer 507 are connected to the same metal wire, and the N-type drain contact layer 508 is connected to a metal wire. Here, since the P-type silicon substrate 501 is connected to ground, a parasitic PNP transistor is formed in which the P-type body layer 506 serves as an emitter, the drain 504 serves as a base, and the P-type silicon substrate 501 as a collector.

In the first DMOS transistor 403 that is manufactured through the above manufacturing processes, the N-type buried layer 502 of the same conductivity type as that of the N-type epitaxial layer 503 is formed below the N-type epitaxial layer 503. This structure makes it possible to reduce power loss caused by the DMOS transistor since an hfe of the parasitic PNP transistor that operates at a time of passing a regenerative current to the power line 401 is lowered and a current is prevented from flowing into the P-type silicon substrate 501 being the ground. In other words, when a regenerative current is passed to the power line 401, holes being minority carriers are injected from the P-type body layer 506 to the drain 504 and flow into the P-type silicon substrate 501. As a result, a bipolar action occurs and a current is passed. However, existence of the N-type buried layer 502 causes holes to be recombined with each other inside the N-type buried layer 502, as a result of which the hfe of the parasitic PNP transistor becomes small.

Here, a technology related to DMOS transistors used in the above output circuit is disclosed in Japanese Patent No. 3372773 publication. This technology is directed to provide inexpensive DMOS transistors in order to minimize costs of chips. Such object is achieved, as shown in FIG. 3, that is a cross-sectional diagram of a DMOS transistor, by using as the drain of the DMOS transistor an N-type well layer 600 used for a P-channel MOS transistor (not illustrated in this figure) that constitutes a complementary metal oxide semiconductor (CMOS) transistor formed in the same substrate. Stated another way, it is possible to provide an inexpensive DMOS transistor since formation of an N-type buried layer and an N-type epitaxial layer is not required.

Furthermore, Japanese Laid-Open Patent application No. 5-190777 publication discloses a technology related to a transistor having an N-type buried layer. This technology is directed to provide an inexpensive Bi-CMOS device that controls noise generated in a bipolar transistor at a time of switching a CMOS transistor. Such object is achieved, as shown in FIG. 4, that is a cross-sectional diagram of a bipolar transistor, by forming an N-type buried layer 610 in a lower part of the bipolar transistor by performing an ion implantation method.

However, since conventional DMOS transistors having an N-type buried layer require formation, on a P-type silicon substrate, of an N-type buried layer and an N-type epitaxial layer, there occurs a problem in that a number of manufacturing processes increases and therefore cost of DMOS transistors becomes high.

Furthermore, the technology disclosed in Japanese Patent No. 3372773 publication is capable of providing an inexpensive DMOS transistor since a drain of the DMOS transistor is formed only by an N-type well layer of the CMOS transistor. However, since it includes no N-type buried layer, holes are not recombined frequently inside the drain, as a result of which a problem occurs in that an hfe of the parasitic PNP transistor becomes high and therefore power loss caused by the DMOS transistor becomes large.

Moreover, a bipolar transistor having an N-type buried layer disclosed in Japanese Laid-Open Patent application No. 5-190777 publication has a problem in that it cannot be used for the above-described output circuit or the like since no parasitic diode is formed.

In view of the above problems, it is conceivable to employ a method that uses, as structure of a DMOS transistor, structure of a bipolar transistor disclosed in Japanese Laid-Open patent application No. 5-190777 publication, as a method of providing an inexpensive DMOS transistor that has a parasitic diode and that lowers the hfe of the parasitic PNP transistor. However, as shown in FIG. 4, that shows structure of the bipolar transistor, existence of a deep N-type well layer between a base of the bipolar transistor and an N-type buried layer makes a current path at power-on time and the N-type buried layer distant from each other. As a result, on-resistance becomes high, which causes another problem in that power consumption is increased. In other words, during an on state, since a large amount of current flows on a surface of the drain, existence of a deep N-type well layer below the P-type body layer allows only a small amount of current to flow into a low-resistance N-type buried layer and on-resistance becomes high as a result.

SUMMARY OF THE INVENTION

The present invention has been conceived in view of the above problems, and it is a first object of the present invention to provide a semiconductor device and a method of manufacture thereof, with the semiconductor device being inexpensive, having a parasitic diode, and lowering an hfe of a parasitic PNP transistor.

A second object of the present invention is to provide a semiconductor device with low on-resistance, and a method of manufacture thereof.

In order to achieve the above objects, the semiconductor device according to the present invention is comprised of: a semiconductor substrate of a first conductivity type; and a gate electrode that is formed above the semiconductor substrate, wherein the semiconductor substrate includes: a well layer of a second conductivity type that is an opposite conductivity type relative to the first conductivity type; a drain contact layer of the second conductivity type formed in the well layer; a body layer of the first conductivity type; a source layer of the second conductivity type that is formed in the body layer; and a buried layer of the second conductivity type, wherein the body layer and the source layer are formed by self alignment that uses the gate electrode as a mask, the drain contact layer is formed opposite the source layer across the body layer below the gate electrode, and the buried layer is formed below the body layer. Here, the buried layer may be formed by performing an ion implantation method or may be formed in the well layer.

Accordingly, since many holes are recombined inside the buried layer, when a parasitic PNP transistor operates in which a body layer serves as an emitter, a well layer and a buried layer serve as a base, and a semiconductor substrate serves as a collector, it becomes possible to provide a semiconductor device that can lower the hfe of the parasitic PNP transistor. Furthermore, since a parasitic diode is formed by the body layer and the well layer, it becomes possible to provide a semiconductor device that has a parasitic diode. What is more, since no N-type buried layer or N-type epitaxial layer is formed on the semiconductor substrate, thereby making it unnecessary to perform epitaxial growth and other processes during manufacturing, it becomes possible to provide an inexpensive semiconductor device.

Furthermore, an upper end of the buried layer may be formed substantially in contact with a bottom end of the body layer, and an impurity concentration of the buried layer may be higher than an impurity concentration of the well layer.

Accordingly, since a current is passed via the buried layer that is a layer with low resistance, when the semiconductor device is turned on, it becomes possible to provide a semiconductor device with low on-resistance.

Moreover, the semiconductor device may further include a local oxidation of silicon (LOCOS) film that is formed on the semiconductor substrate, and the LOCOS film may be formed after the buried layer is formed.

Accordingly, since heat treatment is performed at high temperatures for formation of the LOCOS film, as a result of which the buried layer is spread over a wide rage and many holes are recombined inside the buried layer, it becomes possible to provide a semiconductor device that can further lower the hfe of the parasitic PNP transistor.

Furthermore, the well layer may be formed on a portion in the semiconductor substrate on which the body layer is not formed.

Accordingly, the bottom end of the body layer comes in contact only with the buried layer, as a result of which an impurity concentration in the bottom end of the body layer can be lowered and a junction breakdown voltage in the bottom end of the body layer can be improved. Thus, it becomes possible to provide a semiconductor device that can increase breakdown voltage.

Moreover, the gate electrode may be made up of a first gate electrode and a second gate electrode that are formed above the semiconductor substrate with a predetermined spacing therebetween, and the well layer may be formed by self alignment that uses the first gate electrode and the second gate electrode as masks.

Accordingly, since a distance of well layer and body layer varies depending only on a length of gate electrode, it becomes possible to provide a semiconductor device with stable properties.

Furthermore, a depth of the well layer may be less than a length of the first gate electrode or the second gate electrode that is located above the well layer, and a depth of the well layer may be less than a length of the gate electrode that is located above the well layer.

Accordingly, since a contact area where the well layer faces the semiconductor substrate is reduced and thus a parasitic capacitance to the semiconductor substrate is reduced, it becomes possible to provide a semiconductor device with excellent frequency properties.

Moreover, the well layer may be formed on a portion in the semiconductor substrate on which the body layer is not formed, the LOCOS film may be made up of a first LOCOS film and a second LOCOS film that are formed on the semiconductor substrate with a predetermined spacing therebetween, the gate electrode may be formed on the first LOCOS film and above the semiconductor substrate, astride the first LOCOS film and the semiconductor substrate, and the well layer may be formed by self alignment that uses the first LOCOS film and the second LOCOS film as masks.

Accordingly, since the semiconductor device has a LOCOS offset structure, it becomes possible to provide a semiconductor device that can increase breakdown voltage. Furthermore, since a distance between well layer and body layer varies depending only on misalignment of the LOCOS film and the gate electrode in a darkroom process, it becomes possible to provide a semiconductor device with stable properties.

Also, the present invention may be embodied as a semiconductor manufacturing method that is comprised of: forming a well layer of a second conductivity type in a semiconductor substrate of a first conductivity type, with the second conductivity type being an opposite conductivity type relative to the first conductivity type; forming a buried layer of the second conductivity type in the semiconductor substrate; forming a gate electrode above the semiconductor substrate; forming a body layer of the first conductivity type above the buried layer in the semiconductor substrate, by use of self alignment that uses the gate electrode as a mask; forming a source layer of the second conductivity type in the body layer by use of self alignment that uses the gate electrode as a mask; and forming a drain contact layer of the second conductivity type on a portion, in the well layer, that is opposite the source layer across the body layer located below the gate electrode.

Here, the buried layer may be formed by performing an ion implantation method, and the body layer may be formed in the well layer.

Accordingly, it becomes possible to implement a method of manufacturing a semiconductor device that is inexpensive, has a parasitic diode, and lowers an hfe of a parasitic PNP transistor.

Furthermore, the semiconductor device manufacturing method may further include forming a LOCOS film on the semiconductor substrate, wherein the LOCOS film may be formed after the buried layer is formed.

Accordingly, it becomes possible to implement a method of manufacturing a semiconductor device that can further lower the hfe of the parasitic PNP transistor.

Moreover, the semiconductor device manufacturing method may further include forming a LOCOS film on a portion on the semiconductor substrate on which the body layer is not formed, wherein the LOCOS film, the buried layer, and the body layer may be formed so that an upper end of the buried layer substantially comes in contact with a bottom end of the body layer, and the buried layer may be formed so that an impurity concentration of the buried layer is higher than an impurity concentration of the well layer.

Accordingly, it becomes possible to implement a method of manufacturing a semiconductor device with low on-resistance.

Furthermore, the body layer may be formed on a portion in the semiconductor substrate on which the well layer is not formed.

Accordingly, it becomes possible to implement a method of manufacturing a semiconductor device that can increase breakdown voltage.

Moreover, the gate electrode may be made up of a first gate electrode and a second gate electrode that are formed above the semiconductor substrate with a predetermined spacing therebetween, and the well layer may be formed by self alignment that uses the first gate electrode and the second gate electrode as masks. Furthermore, the LOCOS film may be made up of a first LOCOS film and a second LOCOS film that are formed on the semiconductor substrate with a predetermined spacing therebetween, the gate electrode may be formed on the first LOCOS film and above the semiconductor substrate, astride the first LOCOS film and the semiconductor substrate, the well layer may be formed by self alignment that uses the first LOCOS film and the second LOCOS film as masks, and the body layer may be formed on a portion in the semiconductor substrate on which the well layer is not formed.

Accordingly, it becomes possible to implement a method of manufacturing a semiconductor device with stable properties.

Furthermore, the well layer may be formed so that a depth of the well layer is less than a length of the first gate electrode or the second gate electrode that is located above the well layer, and the well layer may be formed so that a depth of the well layer is less than a length of the gate electrode that is located above the well layer.

Accordingly, it becomes possible to implement a method of manufacturing a semiconductor device with excellent frequency properties.

Moreover, the semiconductor device manufacturing method may further include forming a complementary metal oxide semiconductor (CMOS) transistor in the semiconductor substrate, wherein a well layer of the CMOS transistor may be formed under a same condition as in forming of the well layer.

Accordingly, since a number of manufacturing processes can be reduced, it becomes possible to implement a method of manufacturing a semiconductor device that is further inexpensive.

As is obvious from the above descriptions, it is possible for the semiconductor device of the present invention to provide: a semiconductor device and a manufacture method thereof, with the semiconductor device being capable of lowering an hfe of a parasitic PNP transistor; a semiconductor device and a manufacture method thereof, with the semiconductor device having a parasitic diode; an inexpensive semiconductor device and a manufacture method thereof; a semiconductor device and a manufacture method thereof, with the semiconductor device being capable of reducing on-resistance; a semiconductor device and a manufacture method thereof, with the semiconductor device being capable of increasing breakdown voltage; a semiconductor device and a manufacture method thereof, the semiconductor device having stable properties; and a semiconductor device and a manufacture method thereof, with the semiconductor device having excellent frequency properties.

Thus, the present invention makes it possible to provide a DMOS transistor and a manufacture method thereof, with the DMOS transistor being inexpensive, having a parasitic diode, and being capable of lowering an hfe of a parasitic PNP transistor, and therefore a practical value of the present invention is significantly high.

The disclosure of Japanese Patent Application No. 2004-145584 filed on May 14, 2004 including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings:

FIG. 1 is a circuit diagram showing an example output circuit of a motor driver circuit;

FIG. 2A is a cross-sectional diagram for explaining a method of manufacturing a first DMOS transistor 403 and a second DMOS transistor 406;

FIG. 2B is a cross-sectional diagram for explaining a method of manufacturing the first DMOS transistor 403 and the second DMOS transistor 406;

FIG. 2C is a cross-sectional diagram for explaining a method of manufacturing the first DMOS transistor 403 and the second DMOS transistor 406;

FIG. 3 is a cross-sectional diagram of a DMOS transistor disclosed in Japanese Patent No. 3372773 publication;

FIG. 4 is a cross-sectional diagram of a bipolar transistor disclosed in Japanese Laid-Open Patent application No. 5-190777 publication;

FIG. 7 is a diagram showing a current distribution when the DMOS transistor according to the first embodiment is turned on;

DESCRIPTION OF THE PREFERRED EMBODIMENTS

The following describes a semiconductor device and method of manufacture thereof according to embodiments of the present invention with reference to the drawings.

First Embodiment

Figure 5:
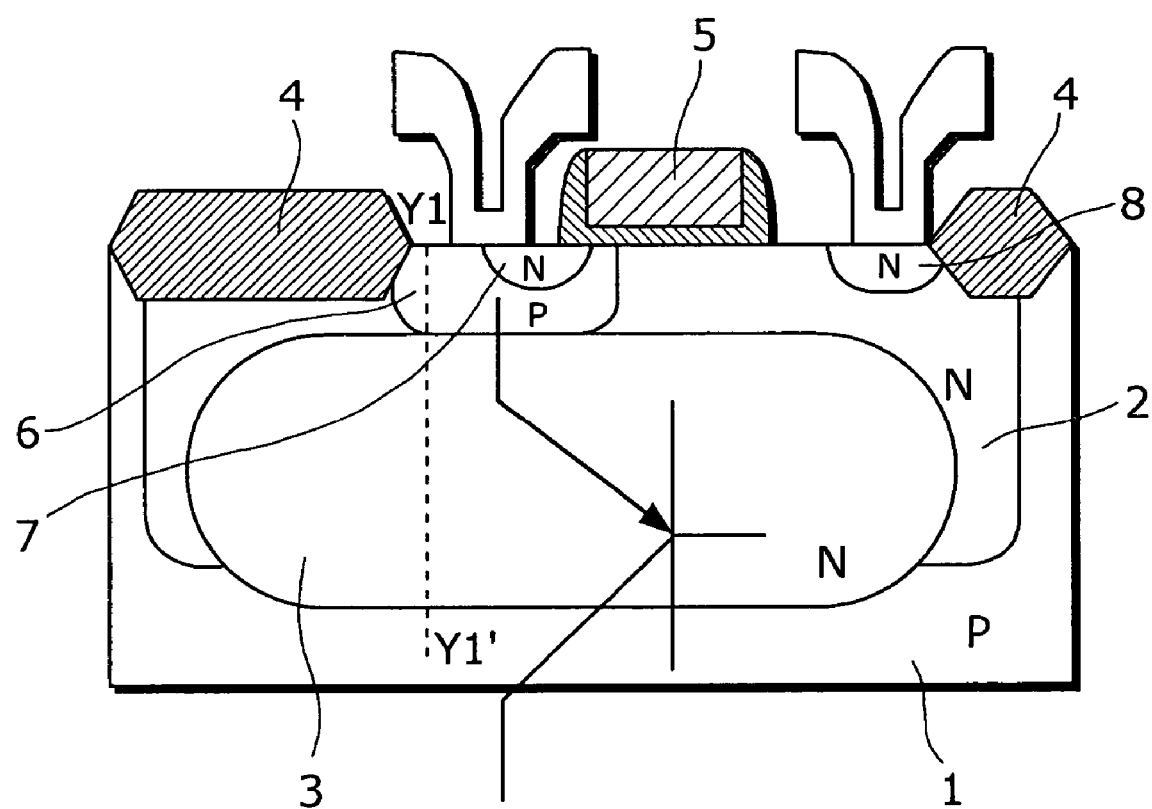
FIG. 5 is a cross-sectional diagram of a DMOS transistor according to a first embodiment of the present invention.

FIG. 5 is a cross-sectional diagram of a DMOS transistor according to a first embodiment of the present invention.

The DMOS transistor according to the present embodiment is comprised of: a P-type silicon substrate 1, in which an N-type well layer 2 and an N-type buried layer 3 are formed; a local oxidation of silicon (LOCOS) film 4 that is a device isolation oxide film formed on the P-type silicon substrate 1; and a gate electrode 5 made of an oxide film and wiring material such as polysilicon and formed above the P-type silicon substrate 1. Here, the N-type well layer 2 and the N-type buried layer 3 serve as a drain of the DMOS transistor.

An impurity concentration of on outer surface of the N-type well layer 2 is around $1\times10^{15}/cm^3$ to $8\times10^{16}/cm^3$, for example. A P-type body layer 6 and an N-type drain contact layer 8 are formed in the N-type well layer 2 in a way that they are exposed at an outer surface of the P-type silicon substrate 1.

The P-type body layer 6 extends to below the gate electrode 5, and a part of the P-type body layer 6 is located below the gate electrode 5. An N-type source layer 7 is formed in the P-type body layer 6 in a way that it is exposed at the outer surface of the P-type silicon substrate 1. The P-type body layer 6 and the N-type source layer 7 are connected to the same metal wire.

The N-type drain contact layer 8 is located opposite the N-type source layer 7 across the P-type body layer 6 formed below the gate electrode 5, and is connected to a metal wire.

The N-type buried layer 3 is located below the P-type body layer 6, and an upper end of the N-type buried layer 3 is substantially in contact with a bottom end of the P-type body layer 6. In other words, the upper end of the N-type buried layer 3 is in contact with the bottom end of the P-type body layer 6, or even when located distant from the bottom end of the P-type body layer 6 in a direction in which the upper end of the N-type buried layer 3 does not overlap with the bottom end of the P-type body layer 6, such distance is not very big, and the upper end of the N-type buried layer 3 is located close to the bottom end of the P-type body layer 6 with a spacing of 0.1 µm to 0.2 µm therebetween. An impurity concentration of the N-type buried layer 3 is higher than that of the N-type well layer 2. In other words, a peak impurity concentration of the N-type buried layer 3 is higher than the impurity concentration of the outer surface of the N-type well layer 2.

Next, referring to cross-sectional diagrams shown in FIGS. 6A to 6D, a description is given of a method of manufacturing a DMOS transistor with the above structure.

Figure 6A:
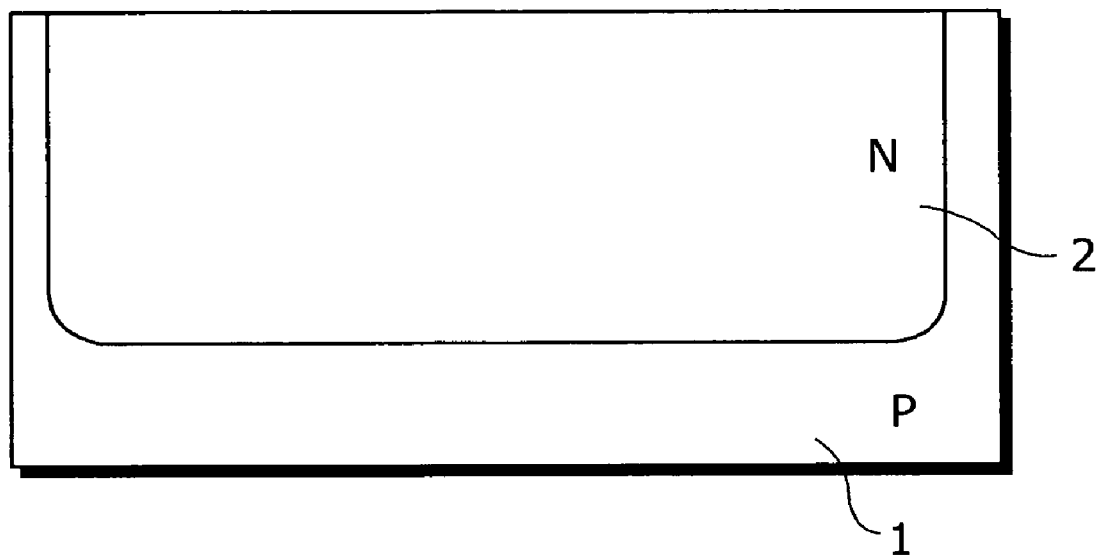
FIG. 6A is a cross-sectional diagram for explaining a method of manufacturing the DMOS transistor according to the first embodiment of the present invention.

First, as shown in FIG. 6A, N-type impurities are implanted by an ion implantation method, and heat treatment is then performed at high temperatures so as to form N-type well layer 2 in P-type silicon substrate 1.

Figure 6B:
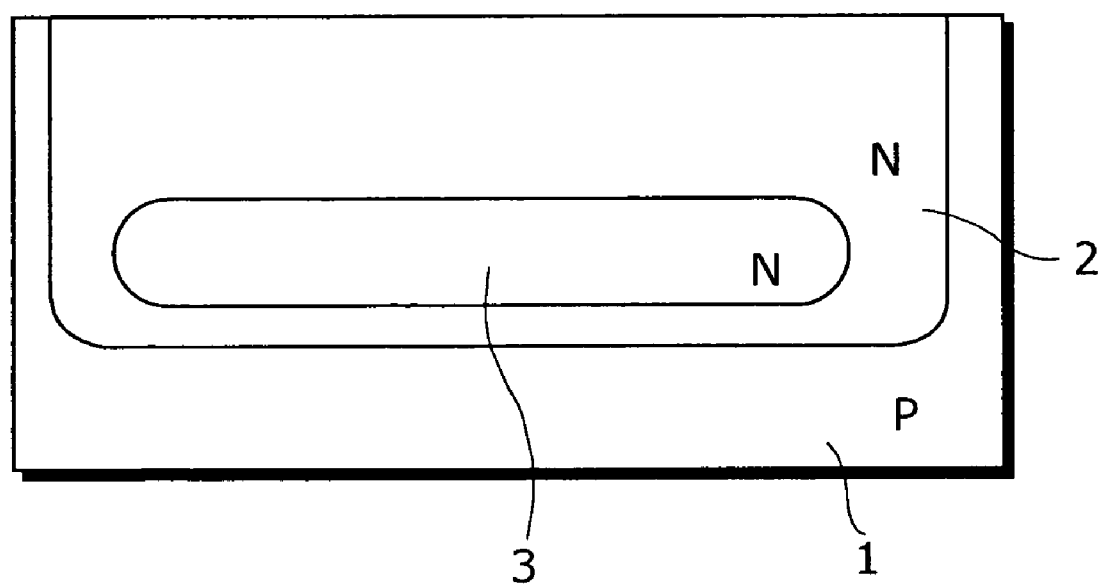
FIG. 6B is a cross-sectional diagram for explaining a method of manufacturing the DMOS transistor according to the first embodiment of the present invention.

Next, as shown in FIG. 6B, N-type impurities are implanted by a high-energy ion implantation method so as to form N-type buried layer 3 in the P-type silicon substrate 1. Then, heat treatment is performed for about 30 minutes at a temperature of 900° C. in a nitrogen atmosphere, for example, so as to recover damages incurred by ion implantation. Ion implantation is performed by implanting N-type impurities such as phosphorus, arsenic and antimony, using implantation energy in the range around 1.5 MeV to 2.5 MeV, for example. It is more preferable if the impurity concentration of the N-type buried layer 3 is higher, but in the case of phosphorus, a dose amount to be handled by a existing implanters is limited around $1 \times 10^{12}/cm^2$ to $3 \times 10^{13}/cm^2$ so as to avoid extreme degradation of production efficiency.

Figure 6C:
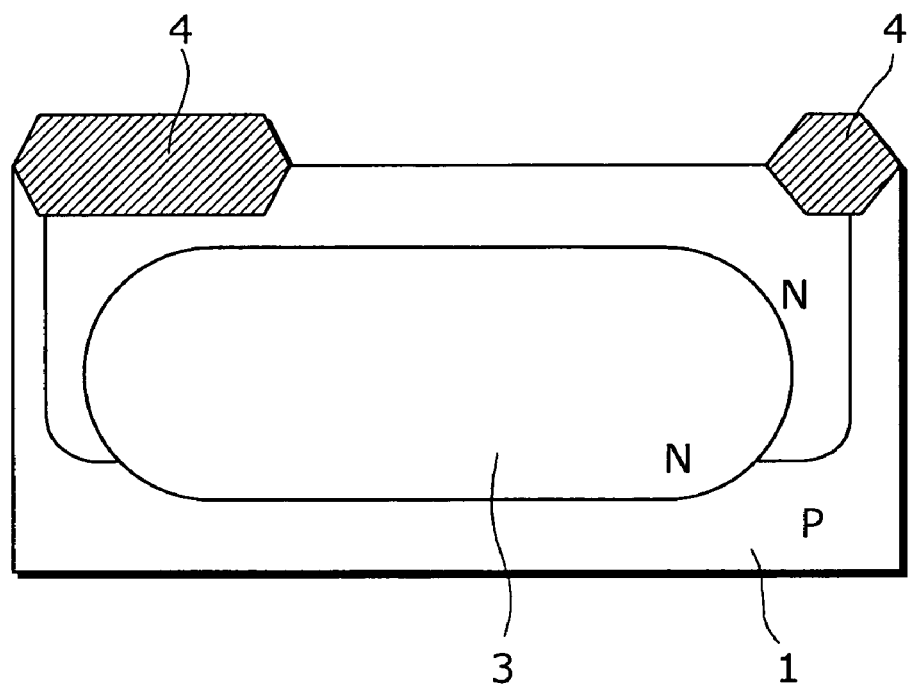
FIG. 6C is a cross-sectional diagram for explaining a method of manufacturing the DMOS transistor according to the first embodiment of the present invention.

Next, as shown in FIG. 6C, a LOCOS film 4 is formed on the P-type silicon substrate 1. In formation of the LOCOS film 4, heat treatment is performed for 100 minutes at a temperature of 1000° C. in an oxidation atmosphere, for example, as a result of which the N-type buried layer 3 is diffused and spread over an outer surface of the P-type silicon substrate 1.

Figure 6D:
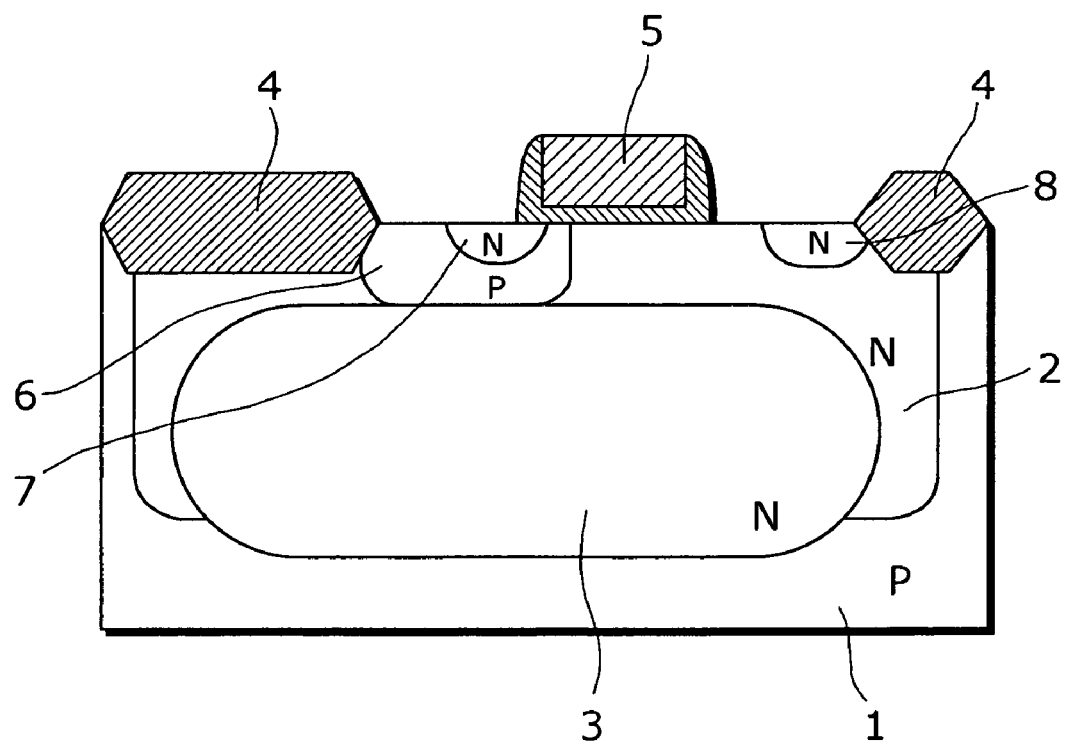
FIG. 6D is a cross-sectional diagram for explaining a method of manufacturing the DMOS transistor according to the first embodiment of the present invention.

Next, as shown in FIG. 6D, a gate electrode 5 is formed above the P-type silicon substrate 1, after which a P-type body layer 6 is formed above the N-type buried layer 3 in the N-type well layer 2 by self alignment that uses the gate electrode as a mask, and then N-type source layer 7 is formed in such P-type body layer 6. Then, N-type drain contact layer 8 is formed on a portion, in the N-type well layer 2, that is distant from the gate electrode 5, and then heat treatment is performed so as to recover damages incurred by ion implantation.

Here, by controlling conditions for ion implantation and heat treatment that are performed in formation of the N-type buried layer 3 and LOCOS film 4, the upper end of the N-type buried layer 3 and the bottom end of the P-type body layer 6 are formed substantially in contact with each other. Note that it is also possible that the upper end of the N-type buried layer 3 and the bottom end of the P-type body layer 6 are formed substantially in contact with each other by controlling conditions for formation of the N-type buried layer 3, the LOCOS film 4, and the P-type body layer 6.

As described above, according to the DMOS transistor of the present embodiment, the use of a DMOS transistor for a circuit shown in FIG. 1 allows a parasitic PNP transistor to operate, with the P-type body layer 6 as an emitter, the N-type well layer 2 and N-type buried layer 3 as a base, and the P-type silicon substrate 1 as a collector. However, since the N-type buried layer 3 with a high impurity concentration is formed below the P-type body layer 6, many holes are recombined inside the N-type buried layer 3. This makes it possible to provide a DMOS transistor that can lower an hfe of the parasitic PNP transistor. For example, the hfe of the parasitic PNP transistor is reduced to one tenth to six tenths compared with conventional DMOS transistors.

Figure 7:
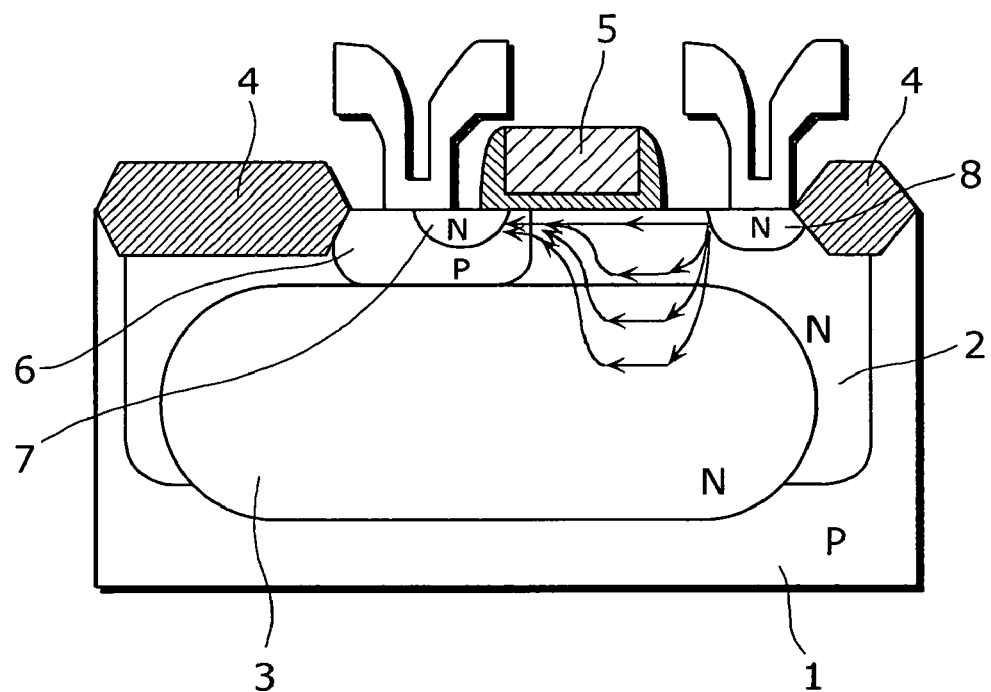

Furthermore, according to the DMOS transistor of the present embodiment, the impurity concentration of the N-type buried layer 3 is higher than that of the N-type well layer 2, and the upper end of the N-type buried layer 3 and the bottom end of the P-type body layer 6 are substantially in contact with each other. Thus, as illustrated in FIG. 7 that shows a current distribution at power-on time, a current flows not only from the N-type drain contact layer 8 to a portion close to the outer surface of the N-type well layer 2, and then flows into the N-type source layer 7 via a channel on the outer surface of the P-type body layer 6, but also flows, in large amount, toward a channel on the outer surface of the P-type body layer 6 from the N-type drain contact layer 8 along the N-type buried layer 3 being a layer with low resistance. Thus, the present embodiment is capable of providing a DMOS transistor with a low on-resistance.

Moreover, according to the DMOS transistor of the present embodiment, a parasitic diode is formed by the P-type body layer 6 and the N-type well layer 2. Thus, the present embodiment is capable of providing a DMOS transistor having a parasitic diode.

What is more, according to the DMOS transistor of the present embodiment, the N-type well layer 2 and the N-type buried layer 3 that serve as a drain are formed in the P-type silicon substrate 1 by performing an ion implantation method. Since this eliminates a necessity to perform epitaxial growth and other processes in manufacture of DMOS transistors, it is possible to provide an inexpensive DMOS transistor.

Furthermore, according to the DMOS transistor of the present embodiment, N-type impurities for formation of the N-type buried layer 3 are implanted before the LOCOS film 4 is formed. Thus, as a result of performing heat treatment at high temperatures for the formation of the LOCOS film 4, the N-type buried layer 3 is diffused over a wide range of areas and many holes are recombined inside the N-type buried layer 3. Accordingly, it becomes possible to provide a DMOS transistor that can further lower the hfe of a parasitic PNP transistor.

Note that descriptions have been given above that, during the manufacturing processes shown in FIGS. 6A and 6B, the N-type buried layer 3 is formed after formation of the N-type well layer 2, but the N-type well layer 2 may be formed after formation of the N-type buried layer 3. In this case, a position of the upper end of the N-type buried layer 3 with respect to the bottom end of the P-type body layer 6 is adjusted by controlling conditions for the formation of the N-type well layer 2, the N-type buried layer 3, and the LOCOS film 4, so that the upper end of the N-type buried layer 3 and the bottom end of the P-type body layer 6 are substantially in contact with each other.

Figure 8:
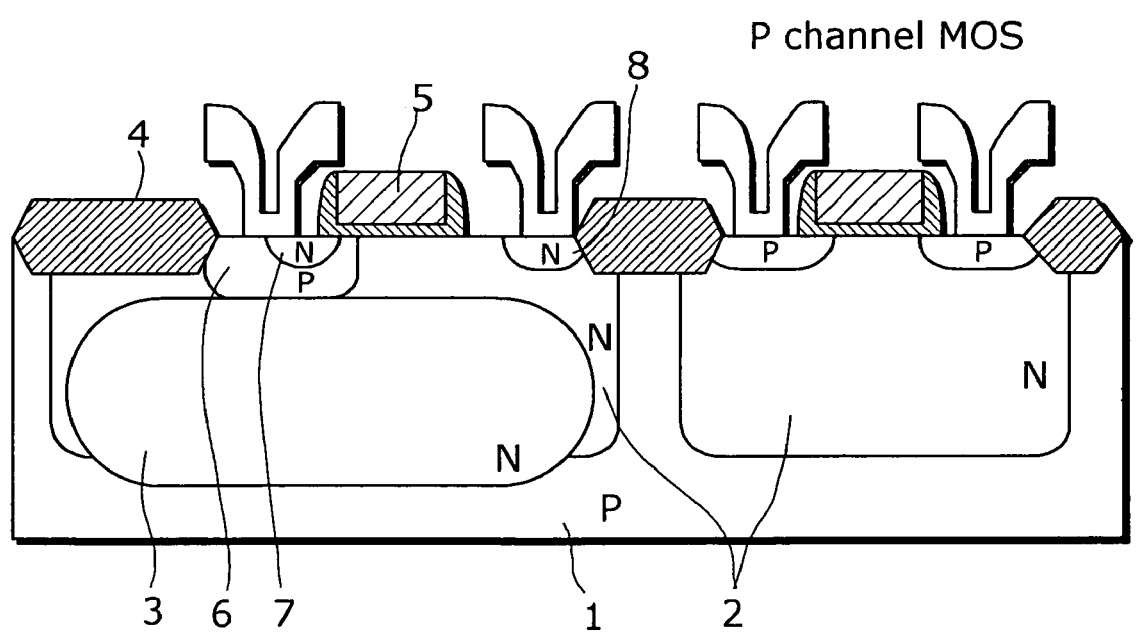
FIG. 8 is a cross-sectional diagram of a DMOS transistor and a CMOS device according to the first embodiment of the present invention.

Furthermore, as illustrated in FIG. 8, that is a cross-sectional diagram of a DMOS transistor and a CMOS device, it is also possible to form a CMOS device and a DMOS transistor in the same P-type silicon substrate 1 and to use the N-type well layer 2 of the P-channel MOS that constitutes the CMOS device as the N-type well layer 2 of the DMOS transistor. In this case, the N-type well layer 2 of the P-channel MOS is formed simultaneously when the N-type well layer 2 of the DMOS transistor is formed. Since this eliminates a necessity to form the N-type well layer 2 of the DMOS transistor, it becomes possible to provide a further inexpensive DMOS transistor.

Second Embodiment

Figure 9:
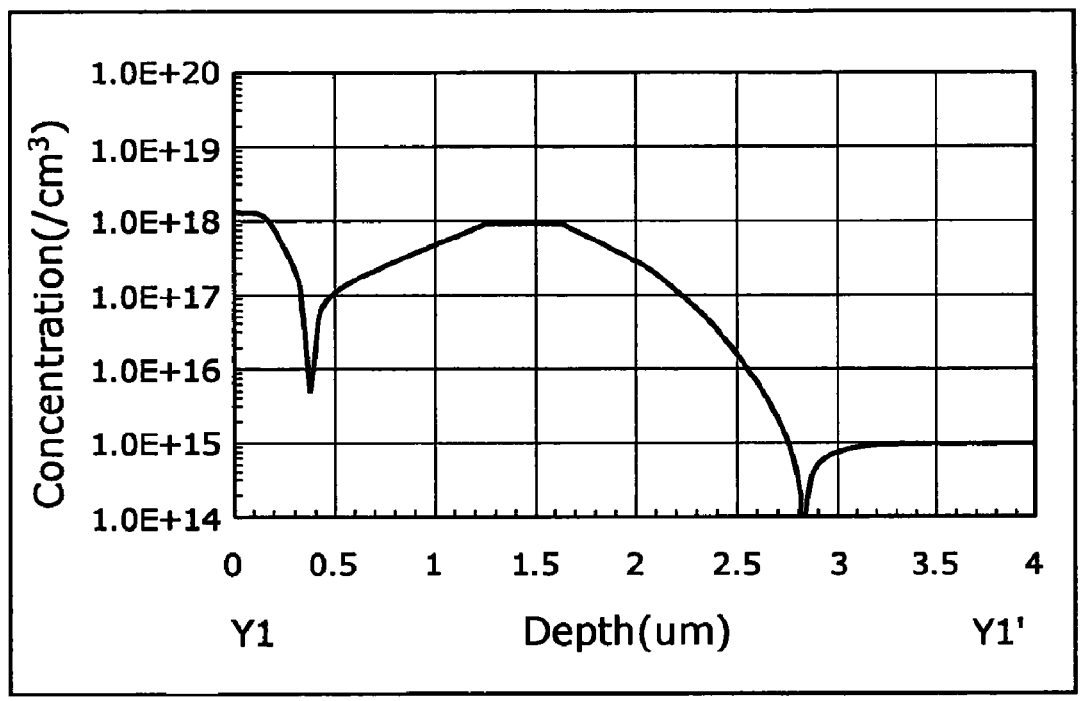
FIG. 9 is a diagram showing an impurity distribution of the DMOS transistor according to the first embodiment of the present invention (an impurity distribution of a Y1-Y1' part shown in FIG. 5)

In the DMOS transistor according to the first embodiment, the P-type body layer is formed in the N-type well layer, and the bottom end of the P-type body layer is substantially in contact with the upper end of the N-type buried layer. Therefore, the bottom end of the P-type body layer is in contact with the N-type well layer and the N-type buried layer. Thus, as indicated in FIG. 9, that shows an impurity distribution of the DMOS transistor (an impurity distribution of the Y1-Y1' part shown in FIG. 5), the bottom end of the P-type body layer has a high impurity concentration of around $8 \times 10^{16}/cm^3$, due to which a junction breakdown voltage in the bottom end of the P-type body layer becomes low. In view of this, a second embodiment aims at providing a DMOS transistor that increases a breakdown voltage. The following descriptions are given, focusing mainly on differences from the first embodiment.

Figure 10:
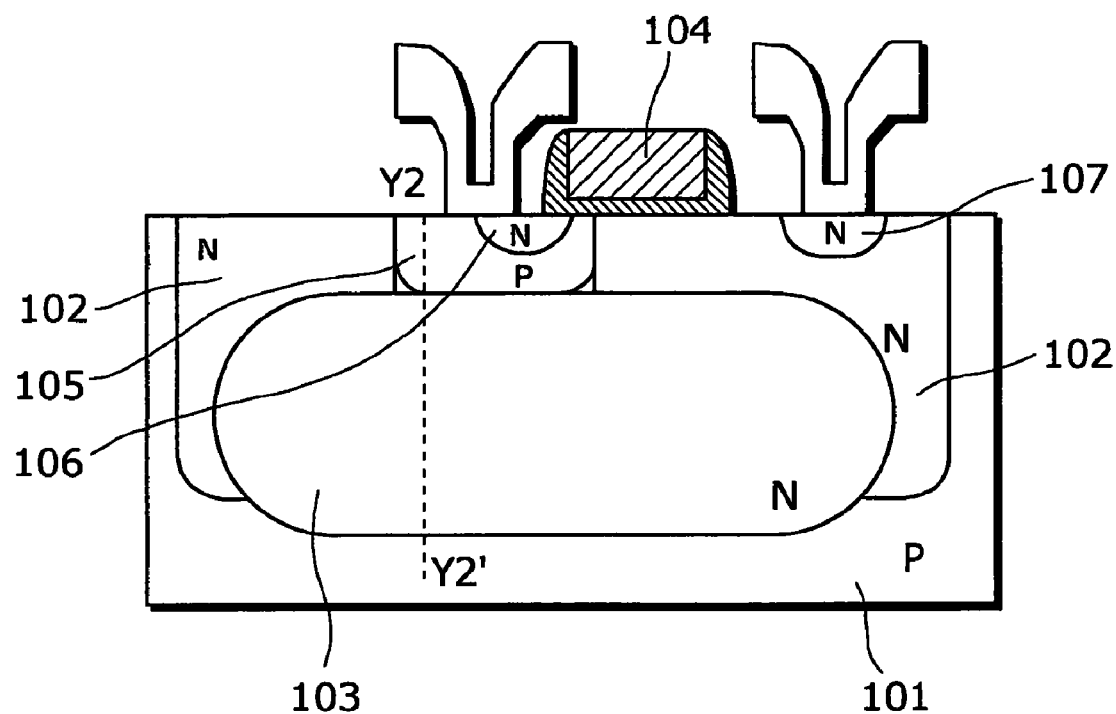
FIG. 10 is a cross-sectional diagram of a DMOS transistor according to a second embodiment of the present invention.

FIG. 10 is a cross-sectional diagram of a DMOS transistor according to the second embodiment of the present invention.

The DMOS transistor according to the present embodiment is comprised of: a P-type silicon substrate 101, in which an N-type well layer 102, an N-type buried layer 103, and a P-type body layer 105 are formed; a gate electrode 104 made of an oxide film and wiring material such as polysilicon; and a LOCOS film (not illustrated in this figure). Here, the N-type well layer 102 and the N-type buried layer 103 serve as a drain of the DMOS transistor.

The P-type body layer 105 extends to below the gate electrode 104, and a part of the P-type body layer 105 is located below the gate electrode 104. An N-type source layer 106 is formed in the P-type body layer 105 in a way that it is exposed at an outer surface of the P-type silicon substrate 101. The P-type body layer 105 and the N-type source layer 106 are connected to the same metal wire.

The N-type well layer 102 is made up of two layers that are located separately on both sides of the P-type body layer 105. An impurity concentration of an outer surface of the N-type well layer 102 is around $1 \times 10^{15}/cm^3$ to $8 \times 10^{16}/cm^3$. An N-type drain contact layer 107 is formed in the N-type well layer 102 in a manner that the N-type drain contact layer 107 is exposed at the outer surface of the P-type silicon substrate 101.

The N-type drain contact layer 107 is located opposite the N-type source layer 106 across the P-type body layer 105 formed below the gate electrode 104, and is connected to a metal wire.

The N-type buried layer 103 is located below the P-type body layer 105, and an upper end of the N-type buried layer 103 is substantially in contact with a bottom end of the P-type body layer 105. In other words, the upper end of the N-type buried layer 103 is in contact with the bottom end of the P-type body layer 105, or even when located distant from the bottom end of the P-type body layer 105 in a direction in which the upper end of the N-type buried layer 103 does not overlap with the bottom end of the P-type body layer 105, such distance is not very big, and the upper end of the N-type buried layer 103 is located close to the bottom end of the P-type body layer 105 with a spacing of 0.1 μm to 0.2 μm to therebetween. An impurity concentration of the N-type buried layer 103 is higher than that of the N-type well layer 102. In other words, a peak impurity concentration of the N-type buried layer 103 is higher than an impurity concentration of the outer surface of the N-type well layer 102.

Next, referring to cross-sectional diagrams shown in FIGS. 11A to 11D, a description is given of a method of manufacturing a DMOS transistor with the above structure.

Figure 11A:
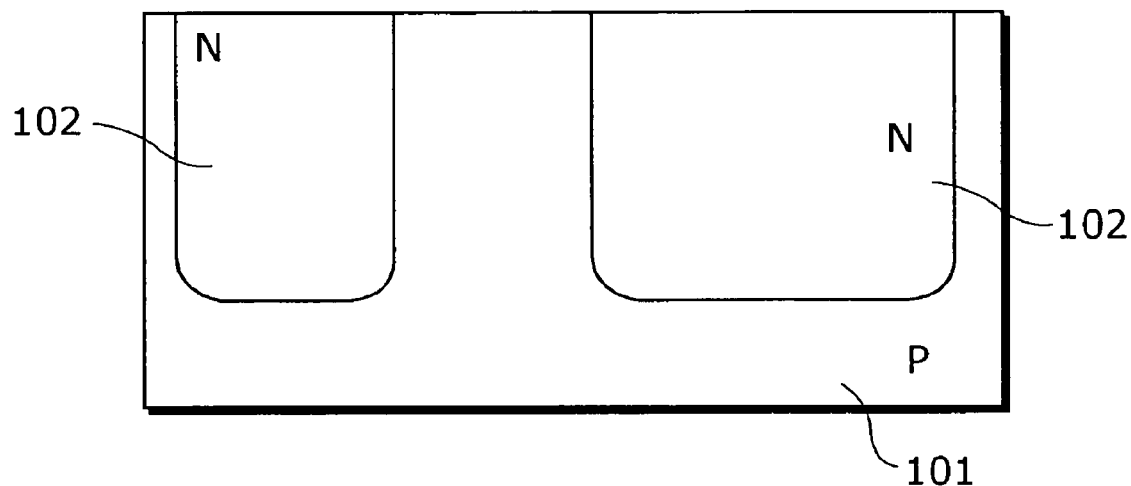
FIG. 11A is a cross-sectional diagram for explaining a method of manufacturing the DMOS transistor according to the second embodiment of the present invention.

First, as shown in FIG. 11A, N-type impurities are implanted by an ion implantation method, and then heat treatment is performed at high temperatures so as to form N-type well layer 102 in P-type silicon substrate 101. When this is done, two layers making up the N-type well layer 102 are formed separately from each other so that no layer is formed on a portion on which P-type body layer 105 is to be formed.

Figure 11B:
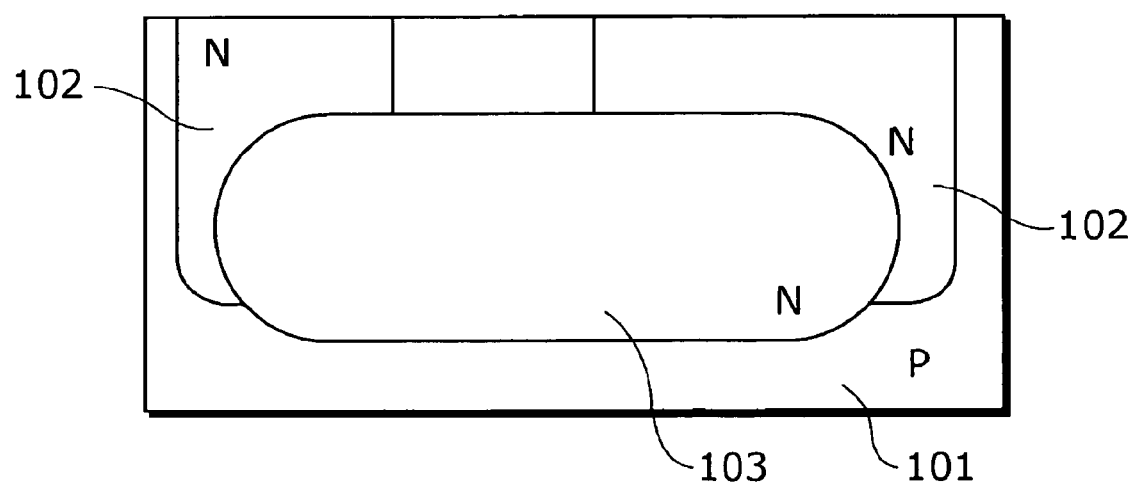
FIG. 11B is a cross-sectional diagram for explaining a method of manufacturing the DMOS transistor according to the second embodiment of the present invention.

Next, as shown in FIG. 11B, N-type impurities are implanted by a high-energy ion implantation method so as to form N-type buried layer 103 in the P-type silicon substrate 101. Note that formation method of the N-type buried layer 103 is the same as that of the DMOS transistor of the first embodiment, and therefore descriptions thereof are omitted.

Figure 11C:
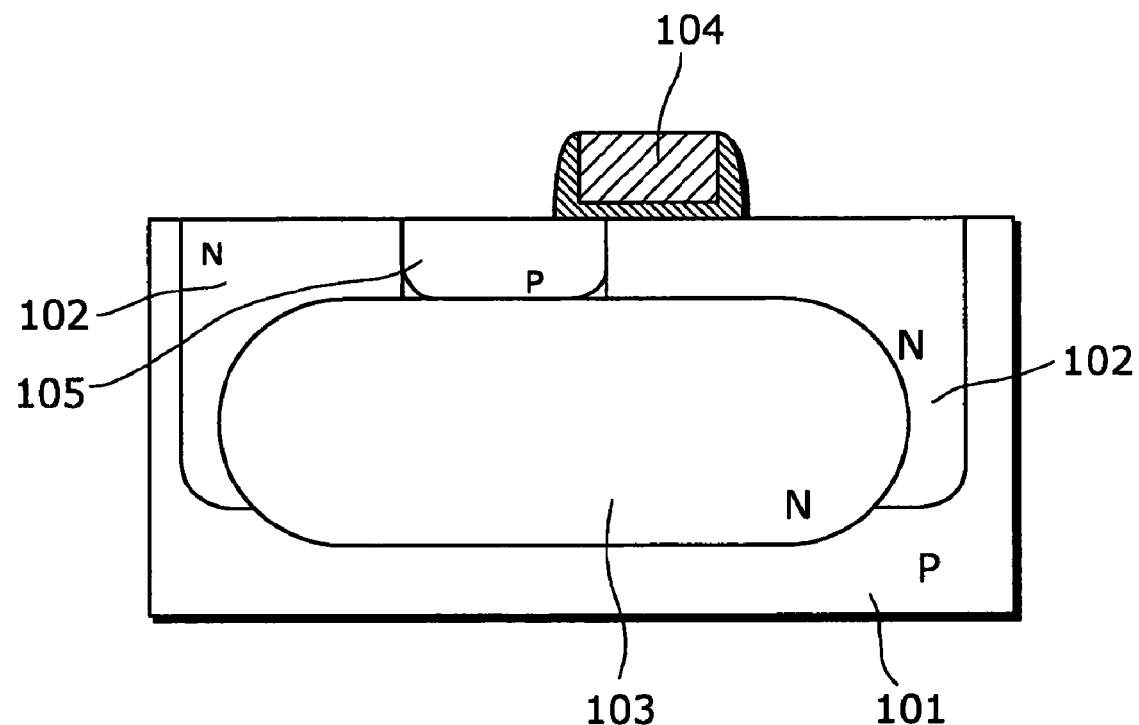
FIG. 11C is a cross-sectional diagram for explaining a method of manufacturing the DMOS transistor according to the second embodiment of the present invention.

Next, as shown in FIG. 11C, a LOCOS film (not illustrated in FIG. 10) is formed and gate electrode 104 is formed above the P-type silicon substrate 101, which is followed by formation of P-type body layer 105 on a portion in the P-type silicon substrate 101 on which the N-type well layer 102 is not formed, by self alignment that uses the gate electrode 104 as a mask. During formation of the LOCOS film, heat treatment is performed for 100 minutes at a temperature of 1000° C. in an oxidation atmosphere, for example, as a result of which the N-type buried layer 103 is diffused and spread over an outer surface of the P-type silicon substrate 101. Here, a condition for formation of the P-type body layer 105 is set so that both sides of the P-type body layer 105 reach respective layers making up the N-type well layer 102.

Figure 11D:
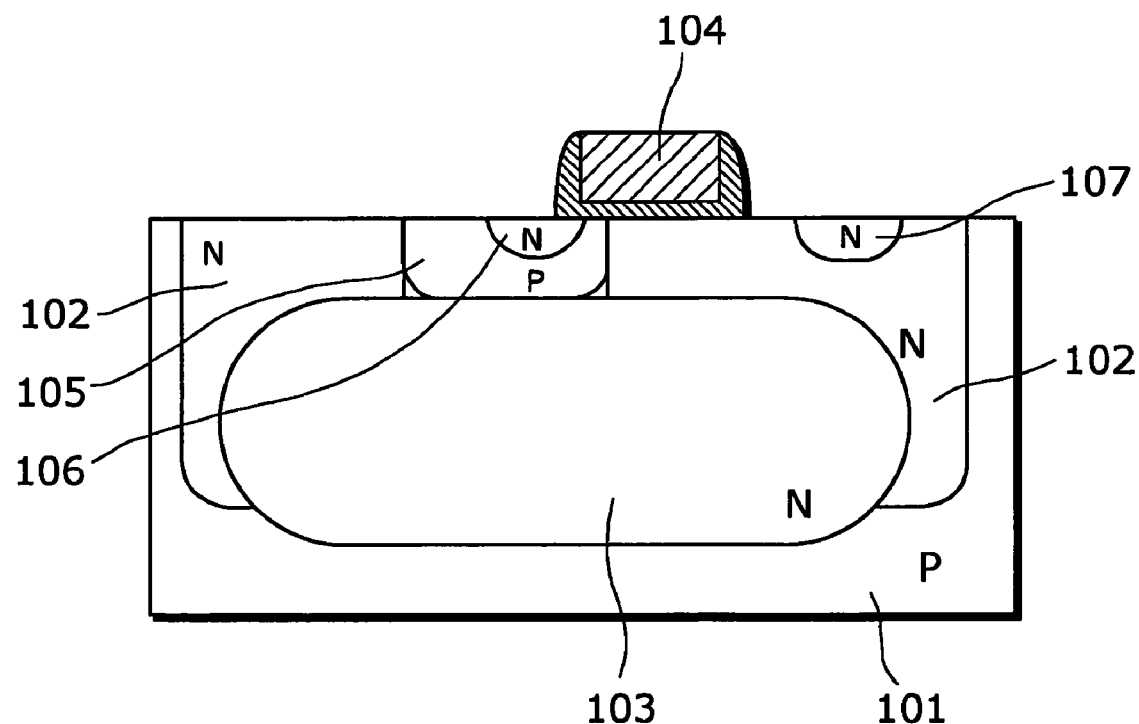
FIG. 11D is a cross-sectional diagram for explaining a method of manufacturing the DMOS transistor according to the second embodiment of the present invention.

Next, as shown in FIG. 11D, an N-type source layer 106 is formed in the P-type body layer 105 by self alignment that uses the gate electrode 104 as a mask, which is followed by formation of N-type drain contact layer 107 on a portion, in the N-type well layer 102, that is distant from the gate electrode 104. Then, heat treatment is performed for about 30 minutes at a temperature of 900° C. in a nitrogen atmosphere, for example, so as to recover damages incurred by ion implantation.

Here, by controlling conditions for ion implantation and heat treatment that are performed during formation of the N-type buried layer 103 and LOCOS film, the upper end of the N-type buried layer 103 and the bottom end of the P-type body layer 105 are formed substantially in contact with each other. Note that it is also possible that the upper end of the N-type buried layer 103 and the bottom end of the P-type body layer 105 are formed substantially in contact with each other by controlling conditions for formation of the N-type buried layer 103, the LOCOS film, and the P-type body layer 105.

As described above, according to the DMOS transistor of the present embodiment, it is possible to provide an inexpensive DMOS transistor that has a parasitic diode, reduces on-resistance, and lowers an hfe of a parasitic PNP transistor, as in the case of the DMOS transistor of the first embodiment.

Furthermore, according to the DMOS transistor of the present embodiment, the P-type body layer 105 is not formed in the N-type well layer 102, and the bottom end of the P-type body layer 105 contacts only with the N-type buried layer 103. This arrangement allows an impurity concentration in the bottom end of the P-type body layer 105 to be lower and thus allows a junction breakdown voltage in the bottom end of the P-type body 105 to increase. Accordingly, it becomes possible to provide a DMOS transistor that can increase a breakdown voltage.

Figure 12:
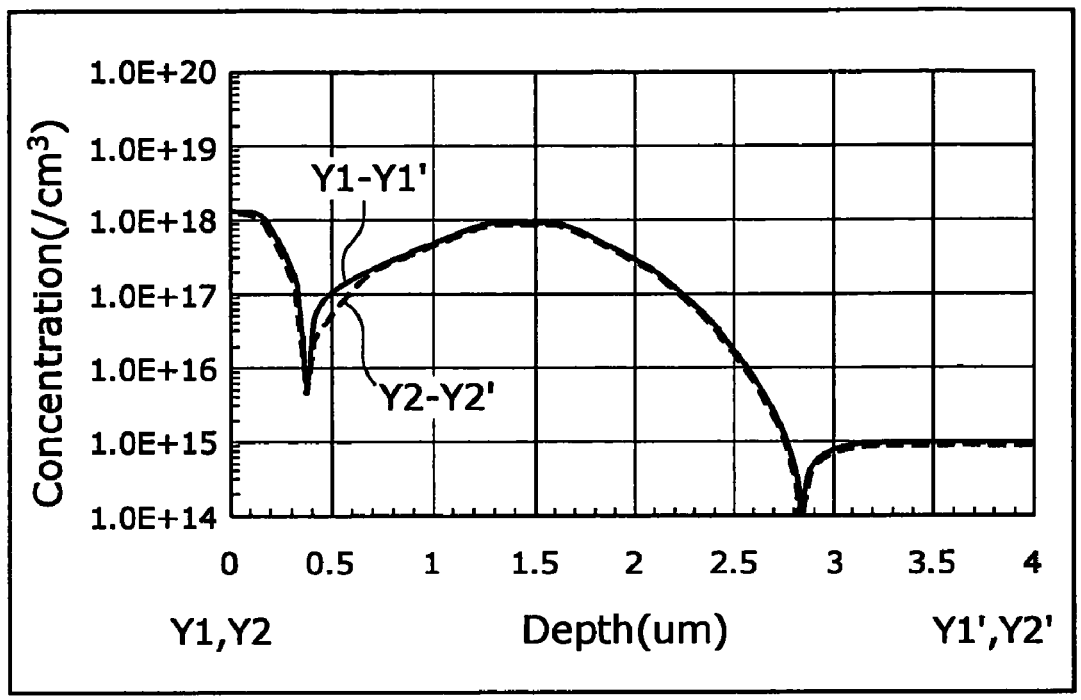
FIG. 12 is a diagram showing an impurity distribution of the DMOS transistor according to the first embodiment (the impurity distribution of the Y1-Y1' part shown in FIG. 5) and an impurity distribution of the DMOS transistor according to the second embodiment (an impurity distribution of a Y2-Y2' part shown in FIG. 10)

FIG. 12 is a diagram showing an impurity distribution of the DMOS transistor. In this drawing, the solid line indicates an impurity distribution of the DMOS transistor of the first embodiment (the impurity distribution of the Y1-Y1' part shown in FIG. 5), whereas the broken line indicates an impurity distribution of the DMOS transistor of the present embodiment (the impurity distribution of a Y2-Y2' part shown in FIG. 10).

It is known from FIG. 12 that the impurity concentration of the bottom end of the P-type body layer 105 is around $2 \times 10^{16}/cm^3$, which is lower than that of the DMOS transistor of the first embodiment.

Note that it is also possible to form a CMOS device and a DMOS transistor in the same P-type silicon substrate and to use the N-type well layer of the P-channel MOS that constitutes the CMOS device as the N-type well layer of the DMOS transistor. In this case, the N-type well layer of the P-channel MOS is formed simultaneously when the N-type well layer of the DMOS transistor is formed. Since this eliminates a necessity to form the N-type well layer of the DMOS transistor, it becomes possible to provide a further inexpensive DMOS transistor.

Third Embodiment

In the DMOS transistor of the second embodiment, the N-type well layer is made up of two layers that are located separately on both sides of the P-type body layer. Since a distance between an N-type well layer and a P-type body layer could vary depending on production tolerance, there could be variations in properties of DMOS transistors. For example, if an N-type well layer and a P-type body layer overlap with each other, the impurity concentration of the P-type body layer corresponding to such overlapping portion becomes low, which causes gate threshold voltage, resistance, or the like to vary. In view of this, a third embodiment aims at providing DMOS transistors whose properties are stable. The following descriptions are given focusing mainly on differences from the second embodiment.

Figure 13:
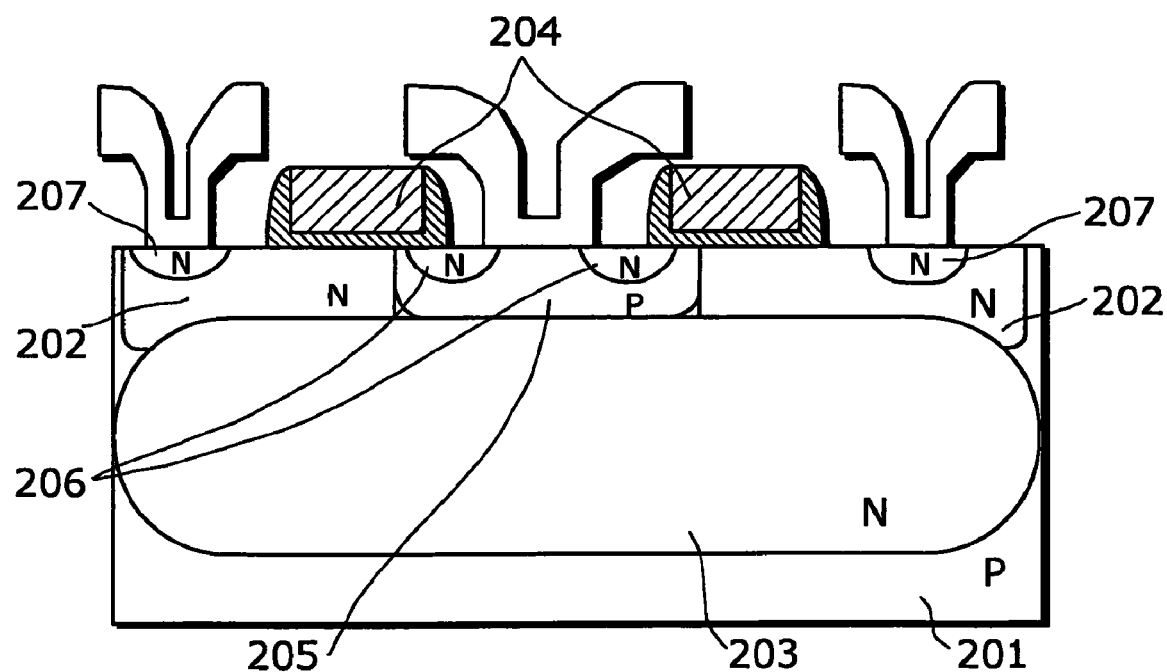
FIG. 13 is a cross-sectional diagram showing a DMOS transistor according to a third embodiment of the present invention.

FIG. 13 is a cross-sectional diagram of a DMOS transistor according to the third embodiment of the present invention.

The DMOS transistor according to the present embodiment is comprised of: a P-type silicon substrate 201, in which an N-type well layer 202, an N-type buried layer 203, and a P-type body layer 205 are formed; a gate electrode 204 made of an oxide film and wiring material such as polysilicon; and a LOCOS film (not illustrated in this figure). Here, the N-type well layer 202 and the N-type buried layer 203 serve as a drain of the DMOS transistor.

The N-type well layer 202 is made up of two layers that are located separately on both sides of the P-type body layer 205. An impurity concentration of an outer surface of the N-type well layer 202 is around $1 \times 10^{15}/cm^3$ to $8 \times 10^{16}/cm^3$, for example. An N-type drain contact layer 207 is formed in each layer of the N-type well layer 202 in a manner that it is exposed at an outer surface of the P-type silicon substrate 201.

The P-type body layer 205 extends to below two gate electrodes that make up the gate electrode 204, and a part of the P-type body layer 205 is located below each of such two gate electrodes. An N-type source layer 206 is formed in the P-type body layer 205 in a way that it is exposed at the outer surface of the P-type silicon substrate 201. The P-type body layer 205 and the N-type source layer 206 are connected to the same metal wire.

Each layer making up the N-type drain contact layer 207 is located opposite each layer making up the N-type source layer 206 across the P-type body layer 205 formed below the gate electrode 204, and is connected to a metal wire.

The N-type buried layer 203 is located below the P-type body layer 205, and an upper end of the N-type buried layer 203 is substantially in contact with a bottom end of the P-type body layer 205. In other words, the upper end of the N-type buried layer 203 is in contact with the bottom end of the P-type body layer 205, or even when located distant from the bottom end of the P-type body layer 205 in a direction in which the upper end of the N-type buried layer 203 does not overlap with the bottom end of the P-type body layer 205, such distance is not very big, and the upper end of the N-type buried layer 203 is located close to the bottom end of the P-type body layer 205 with a spacing of 0.1 μm to 0.2 μm therebetween. An impurity concentration of the N-type buried layer 203 is higher than that of the N-type well layer 202. In other words, a peak impurity concentration of the N-type buried layer 203 is higher than an impurity concentration of the outer surface of the N-type well layer 202.

The gate electrode 204 is made up of two gate electrodes that are formed above the P-type silicon substrate 201 with a predetermined spacing therebetween.

Next, referring to cross-sectional diagrams shown in FIGS. 14A to 14D, a description is given of a method of manufacturing a DMOS transistor with the above structure.

Figure 14A:
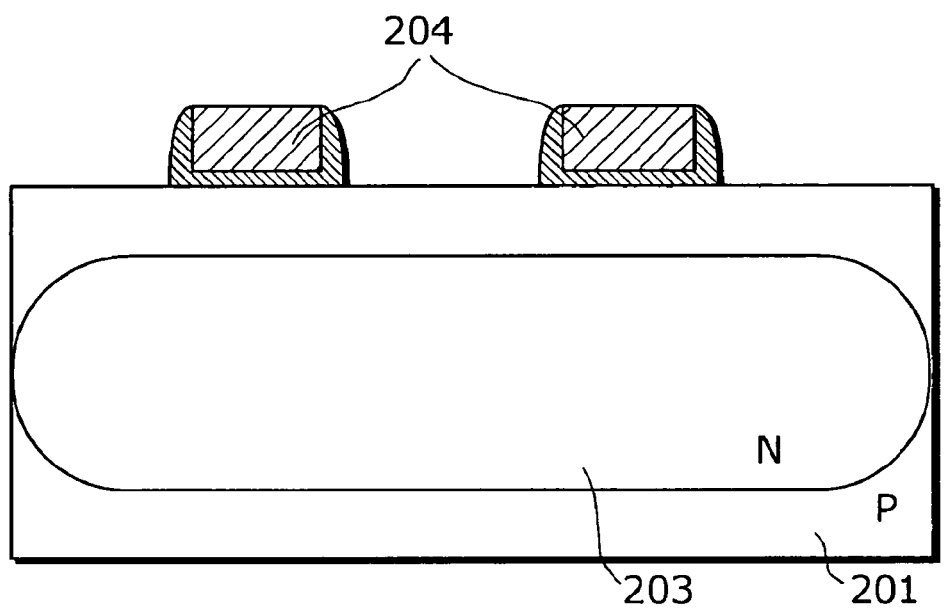
FIG. 14A is a cross-sectional diagram for explaining a method of manufacturing the DMOS transistor according to the third embodiment of the present invention.

First, as shown in FIG. 14A, N-type impurities are implanted by a high-energy ion implantation method, and then heat treatment is performed for about 30 minutes at a temperature of 900° C. in a nitrogen atmosphere, for example, so as to recover damages incurred by ion implantation. N-type buried layer 203 is formed in P-type silicon substrate 201, and then a LOCOS film (not illustrated in the drawing) is formed thereon and gate electrode 204 is formed above the P-type silicon substrate 201. During formation of the LOCOS film, heat treatment is performed for 100 minutes at a temperature of 1000° C. in an oxidation atmosphere, for example, as a result of which the N-type buried layer 203 is diffused and spread over an outer surface of the P-type silicon substrate 201. Note that a formation method of the N-type buried layer 203 is the same as that of the DMOS transistor of the first embodiment, and therefore descriptions thereof are omitted.

Figure 14B:
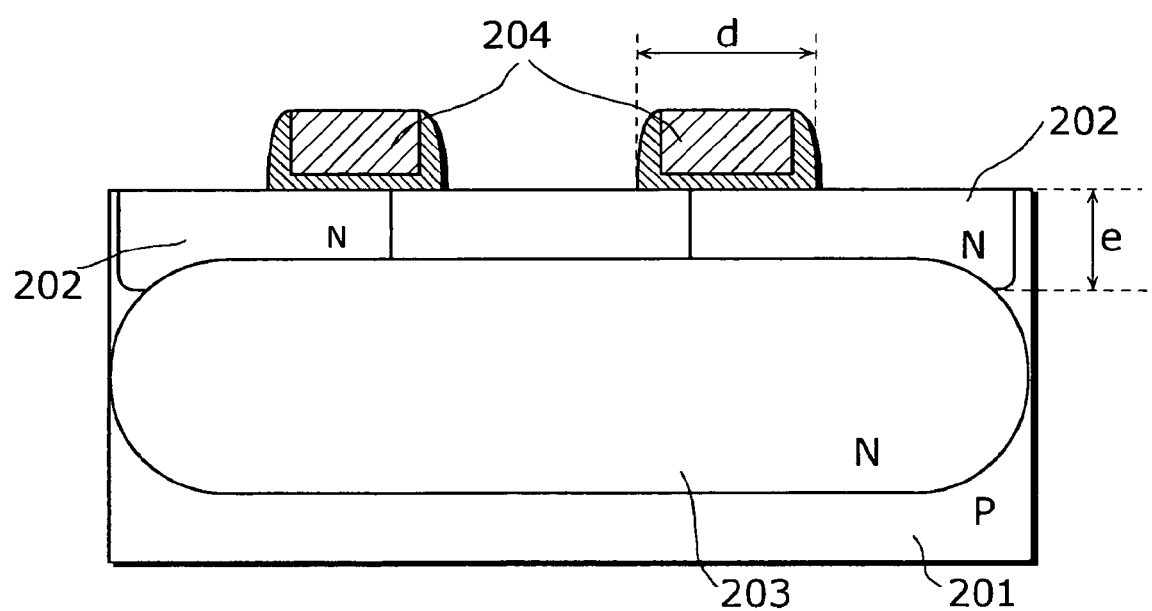
FIG. 14B is a cross-sectional diagram for explaining a method of manufacturing the DMOS transistor according to the third embodiment of the present invention.

Next, as shown in FIG. 14B, N-type well layer 202 is formed in the P-type silicon substrate 201 by self alignment that uses the gate electrode 204 as a mask. When this is done, two layers making up the N-type well layer 202 are formed separately from each other so that no layer is formed on a portion on which a P-type body layer 205 is to be formed. Furthermore, since each layer making up the N-type well layer 202 extends to below each gate electrode making up the gate electrode 204, it is necessary to form the N-type well layer 202 in a way that it does not extend further to an opposite position of its formation across the gate electrode 204. Thus, a condition for formation of the N-type well layer 202 is set so that depth "e" of each layer making up the N-type well layer 202 is less than a length "d" of each gate electrode making up the gate electrode 204. For example, in a case where the length "d" of each gate electrode making up the gate electrode 204 is 1 μm, a condition for formation of the N-type well layer 202 is such as makes the depth "e" of each layer making the N-type well layer 202 be at most 0.7 μm.

Figure 14C:
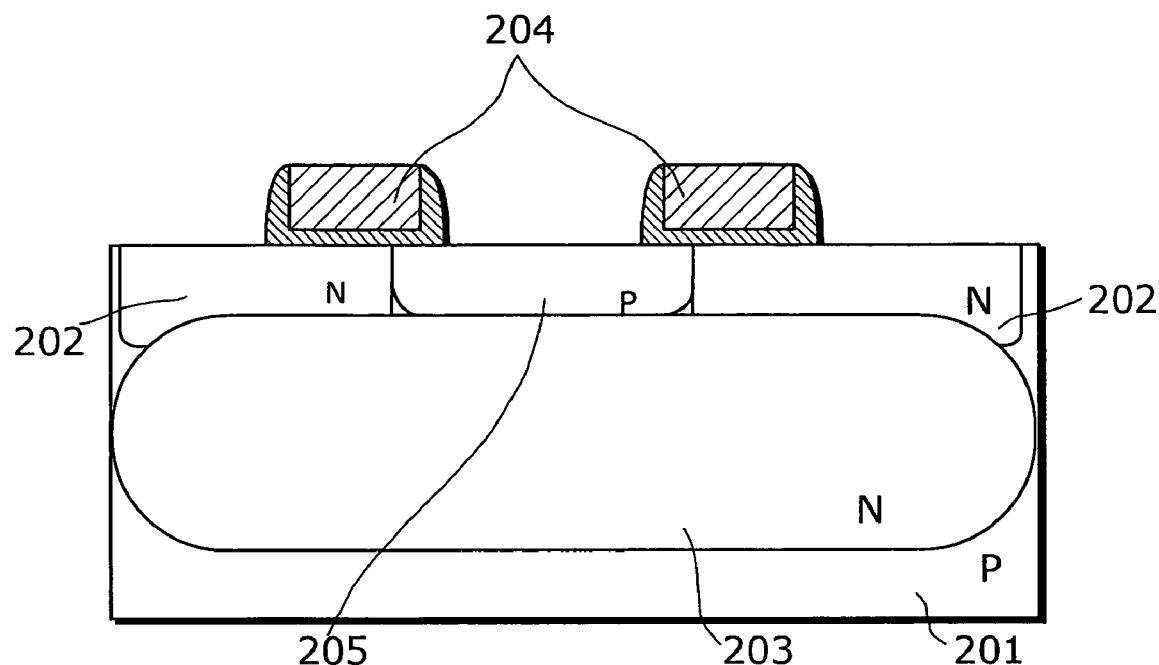
FIG. 14C is a cross-sectional diagram for explaining a method of manufacturing the DMOS transistor according to the third embodiment of the present invention.

Next, as shown in FIG. 14C, a P-type body layer 205 is formed on a portion in the P-type silicon substrate 201 on which the N-type well layer 202 is not formed, by self alignment that uses the gate electrode 204 as a mask. Here, a condition for formation of the P-type body layer 205 is set so that both sides of the P-type body layer 205 reach the respective layers making up the N-type well layer 202.

Figure 14D:
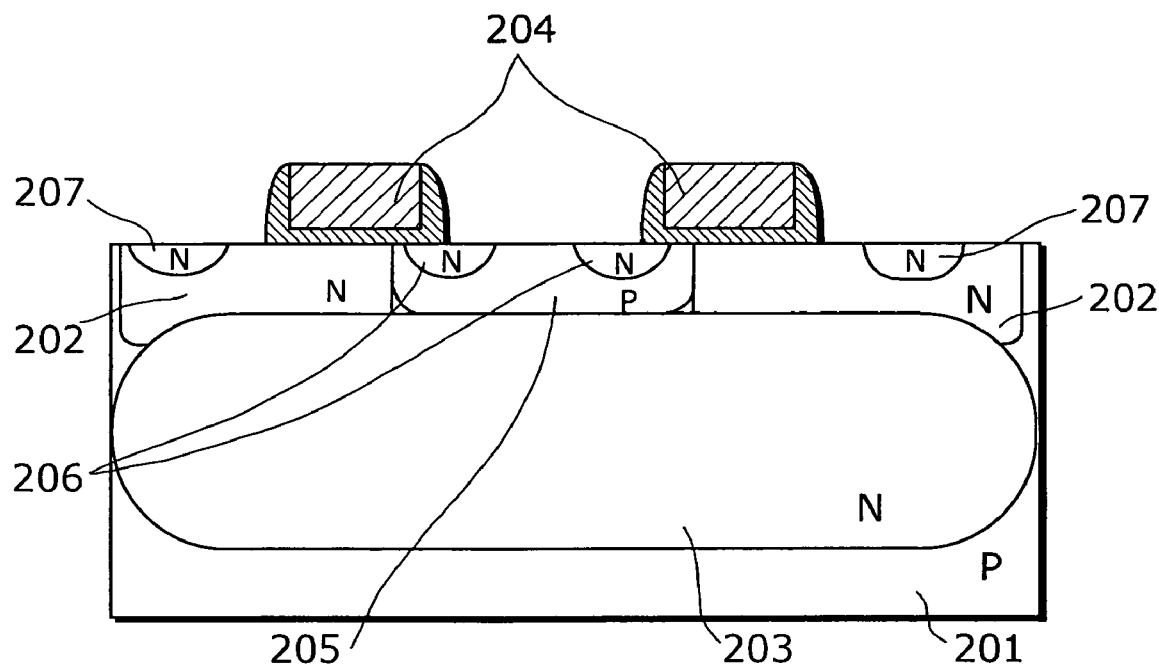
FIG. 14D is a cross-sectional diagram for explaining a method of manufacturing the DMOS transistor according to the third embodiment of the present invention.

Next, as shown in FIG. 14D, an N-type source layer 206 made up of two layers is formed in the P-type body layer 205 by self alignment that uses the gate electrode 204 as a mask, which is followed by formation of each layer of an N-type drain contact layer 207 on a portion, in each layer making up the N-type well layer 202, that is distant from each gate electrode making up the gate electrode 204. Then, heat treatment is performed for about 30 minutes at a temperature of 900° C. in a nitrogen atmosphere, for example, so as to recover damages incurred by ion implantation.

Here, by controlling conditions for ion implantation and heat treatment that are performed during formation of the N-type buried layer 203 and LOCOS film, an upper end of the N-type buried layer 203 and a bottom end of the P-type body layer 205 are formed substantially in contact with each other. Note that it is also possible that the upper end of the N-type buried layer 203 and the bottom end of the P-type body layer 205 are formed substantially in contact with each other by controlling conditions for formation of the N-type buried layer 203, the LOCOS film, and the P-type body layer 205.

As described above, according to the DMOS transistor of the present embodiment, it is possible to provide an inexpensive DMOS transistor that has a parasitic diode, reduces on-resistance, and lowers an hfe of a parasitic PNP transistor, as in the case of the DMOS transistor of the first embodiment.

Furthermore, according to the DMOS transistor of the present embodiment, the P-type body layer 205 and the N-type well layer 202 are formed by self alignment that uses the gate electrode 204 as a mask. Accordingly, a distance between N-type well layer 202 and P-type body layer 205 varies depending only on a length of a gate electrode 204. Meanwhile, according to the DMOS transistor of the second embodiment, the distance between N-type well layer 202 and P-type body layer 205 varies depending on misalignment of an N-type well layer 202 and a gate electrode 204 in a darkroom process. Accordingly, the present embodiment is capable of providing DMOS transistors with stable properties.

Moreover, according to the DMOS transistor of the present embodiment, the depth of the N-type well layer 202 is set to be less than the length of the gate electrode 204. In other words, the depth of the N-type well layer 202 is shallower compared with the DMOS transistor of the second embodiment. This makes it possible to reduce a contact area where the N-type well layer 202 faces the P-type silicon substrate 201, and thus to reduce a parasitic capacitance to the P-type silicon substrate 201. Accordingly, it becomes possible to provide a DMOS transistor with excellent frequency properties.

Note that it is also possible to form a CMOS device and a DMOS transistor in the same P-type silicon substrate and to use the N-type well layer of a P-channel MOS that constitutes the CMOS device as the N-type well layer of the DMOS transistor. In this case, the N-type well layer of the P-channel MOS is formed simultaneously when the N-type well layer of the DMOS transistor is formed. Since this eliminates a necessity to form the N-type well layer of the DMOS transistor, it becomes possible to provide a further inexpensive DMOS transistor.

Fourth Embodiment

Figure 15:
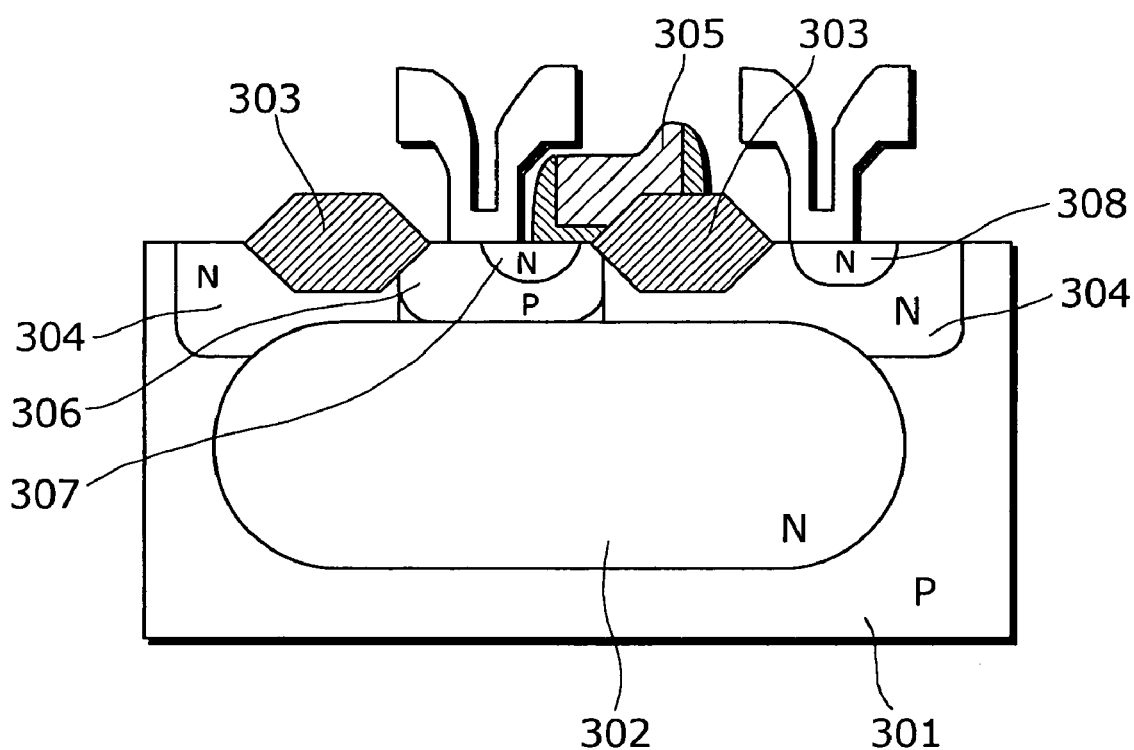
FIG. 15 is a cross-sectional diagram of a DMOS transistor according to a fourth embodiment of the present invention.

FIG. 15 is a cross-sectional diagram of a DMOS transistor according to a fourth embodiment of the present invention.

The DMOS transistor according to the present embodiment has a LOCOS offset structure, and is comprised of: a P-type silicon substrate 301, in which an N-type buried layer 302, an N-type well layer 304, and a P-type body layer 306 are formed; a LOCOS film 303 that is a device isolation oxide film; and a gate electrode 305 made of an oxide film and wiring material such as polysilicon.

The N-type well layer 304 is made up of two layers that are located separately on both sides of the P-type body layer 306. An impurity concentration of an outer surface of the N-type well layer 304 is around $1 \times 10^{15}/cm^3$ to $8 \times 10^{16}/cm^3$, for example. An N-type drain contact layer 308 is formed in the N-type well layer 304 in a manner that it is exposed at an outer surface of the P-type silicon substrate 301.

The P-type body layer 306 extends to below a gate electrode 305, and a part of the P-type body layer 306 is located below the gate electrode 305. An N-type source layer 307 is formed in the P-type body layer 306 in a way that it is exposed at the outer surface of the P-type silicon substrate 301. The P-type body layer 306 and the N-type source layer 307 are connected to the same metal wire.

The N-type drain contact layer 308 is located opposite the N-type source layer 307 across the P-type body layer 306 formed below the gate electrode 305, and are connected to a metal wire.

The N-type buried layer 302 is located below the P-type body layer 306, and an upper end of the N-type buried layer 302 is substantially in contact with a bottom end of the P-type body layer 306. In other words, the upper end of the N-type buried layer 302 is in contact with the bottom end of the P-type body layer 306, or even when located distant from the bottom end of the P-type body layer 306 in a direction in which the upper end of the N-type buried layer 302 does not overlap with the bottom end of the P-type body layer 306, such distance is not very big, and the upper end of the N-type buried layer 302 is located close to the bottom end of the P-type body layer 306 with a spacing of 0.1 µm to 0.2 µm therebetween. An impurity concentration of the N-type buried layer 302 is higher than that of the N-type well layer 304. In other words, a peak impurity concentration of the N-type buried layer 302 is higher than an impurity concentration of an outer surface of the N-type well layer 304.

The LOCOS film 303 is made up of two LOCOS films that are formed on the P-type silicon substrate 301 with a predetermined spacing therebetween.

The gate electrode 305 is formed above the P-type silicon substrate 301 and on the LOCOS film 303, astride the P-type silicon substrate 301 and the LOCOS film 303.

Next, referring to cross-sectional diagrams shown in FIGS. 16A to 16D, a description is given of a method of manufacturing a DMOS transistor with the above structure.

Figure 16A:
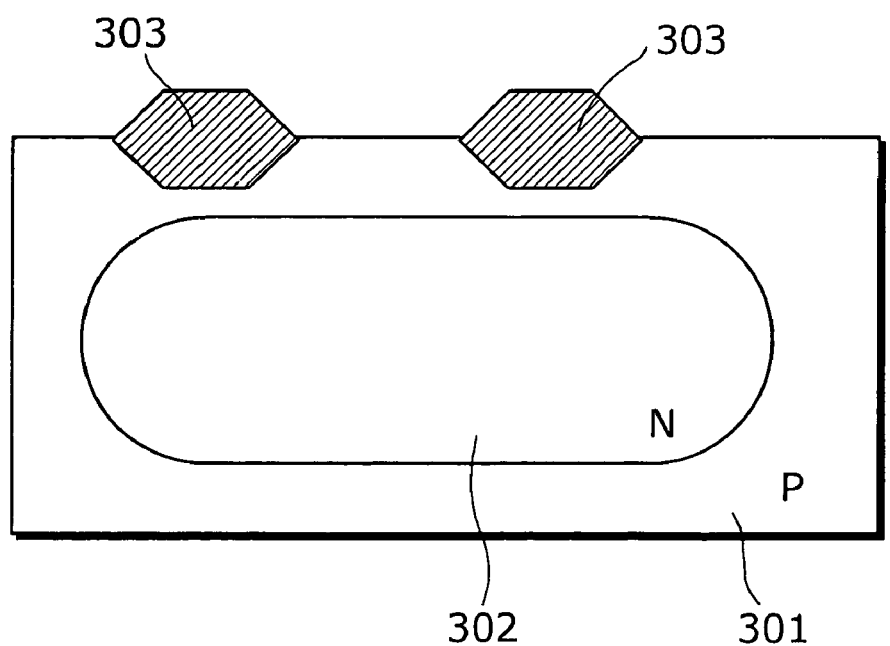
FIG. 16A is a cross-sectional diagram for explaining a method of manufacturing the DMOS transistor according to the fourth embodiment of the present invention.

First, as shown in FIG. 16A, N-type impurities are implanted by a high-energy ion implantation method, and then heat treatment is performed for about 30 minutes at a temperature of 900° C. in a nitrogen atmosphere, for example, so as to recover damages incurred by ion implantation. N-type buried layer 302 is formed in P-type silicon substrate 301, and then LOCOS film 303 is formed on the P-type silicon substrate 301. During formation of the LOCOS film 303, heat treatment is performed for 100 minutes at a temperature of 1000° C. in an oxidation atmosphere, for example, as a result of which the N-type buried layer 302 is diffused and spread over an outer surface of the P-type silicon substrate 301. Note that a formation method of the N-type buried layer 302 is the same as that of the DMOS transistor of the first embodiment, and therefore descriptions thereof are omitted.

Figure 16B:
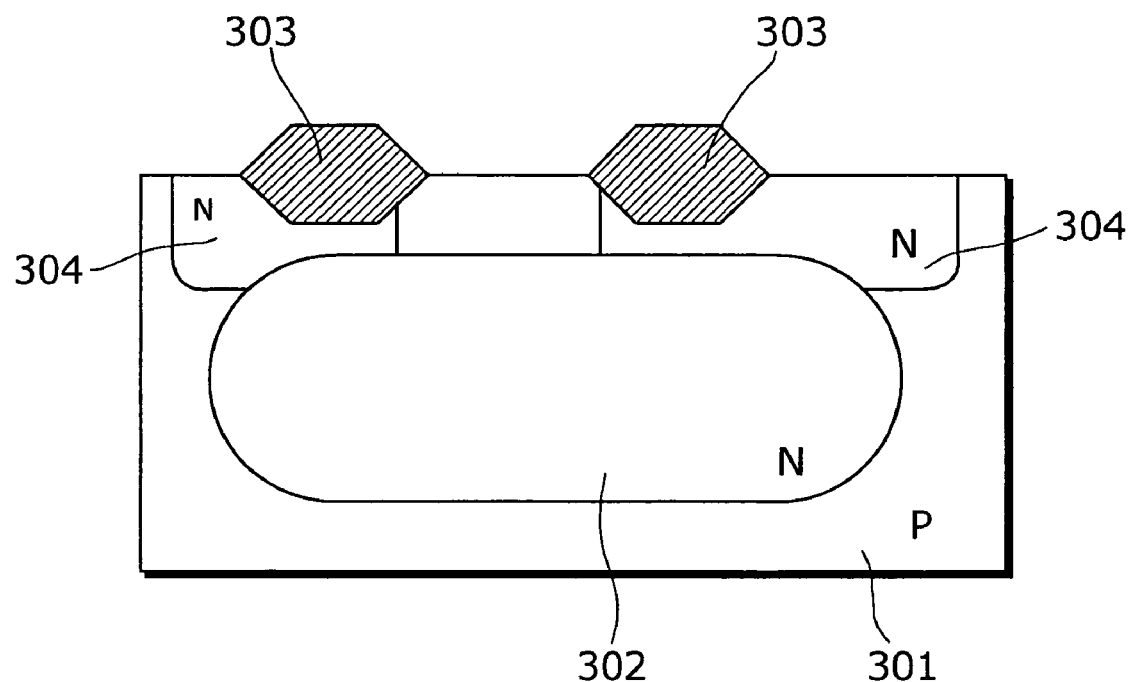
FIG. 16B is a cross-sectional diagram for explaining a method of manufacturing the DMOS transistor according to the fourth embodiment of the present invention.

Next, as shown in FIG. 16B, N-type well layer 304 is formed in the P-type silicon substrate 301 by self alignment that uses the LOCOS film 303 as a mask. When this is done, layers making up the N-type well layer 304 are formed separately from each other so that no layer is formed on a portion on which P-type body layer 306 is to be formed. Furthermore, since the N-type well layer 304 extends to below the gate electrode 305, it is necessary to form the N-type well layer 304 in a way that it does not extend further to an opposite position of its formation across the gate electrode 305. Thus, a condition for formation of the N-type well layer 304 is set so that a depth of each layer making up the N-type well layer 304 is less than a length of the gate electrode 305.

Figure 16C:
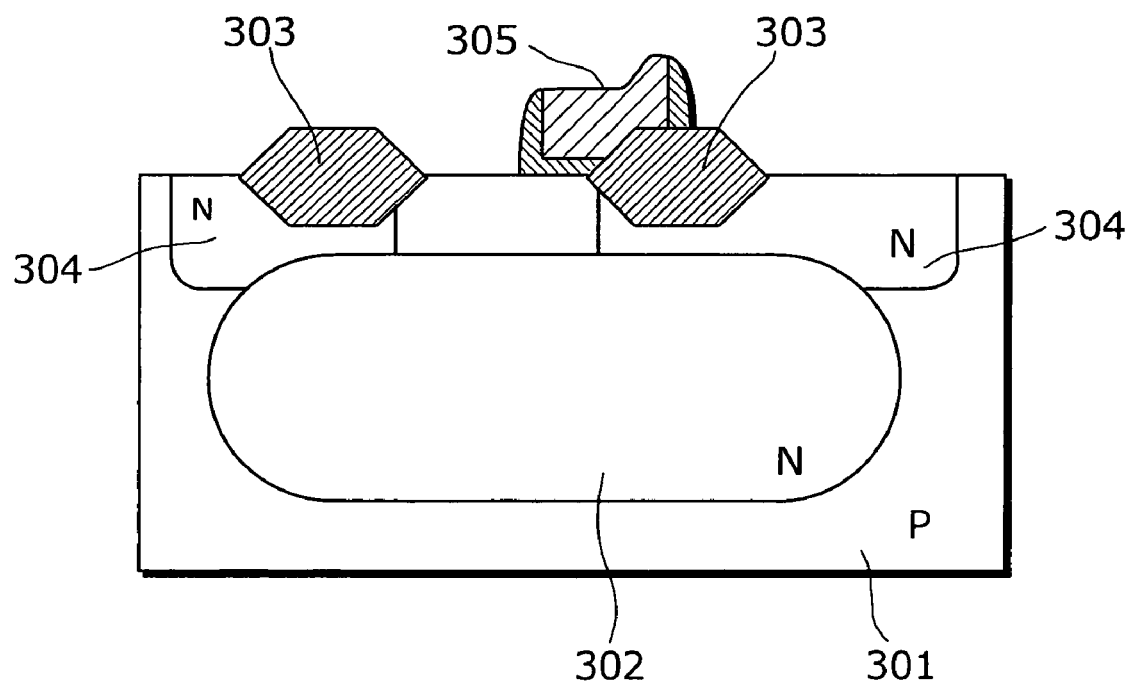
FIG. 16C is a cross-sectional diagram for explaining a method of manufacturing the DMOS transistor according to the fourth embodiment of the present invention.

Next, as shown in FIG. 16C, the gate electrode 305 is formed astride the P-type silicon substrate 301 and the LOCOS film 303.

Figure 16D:
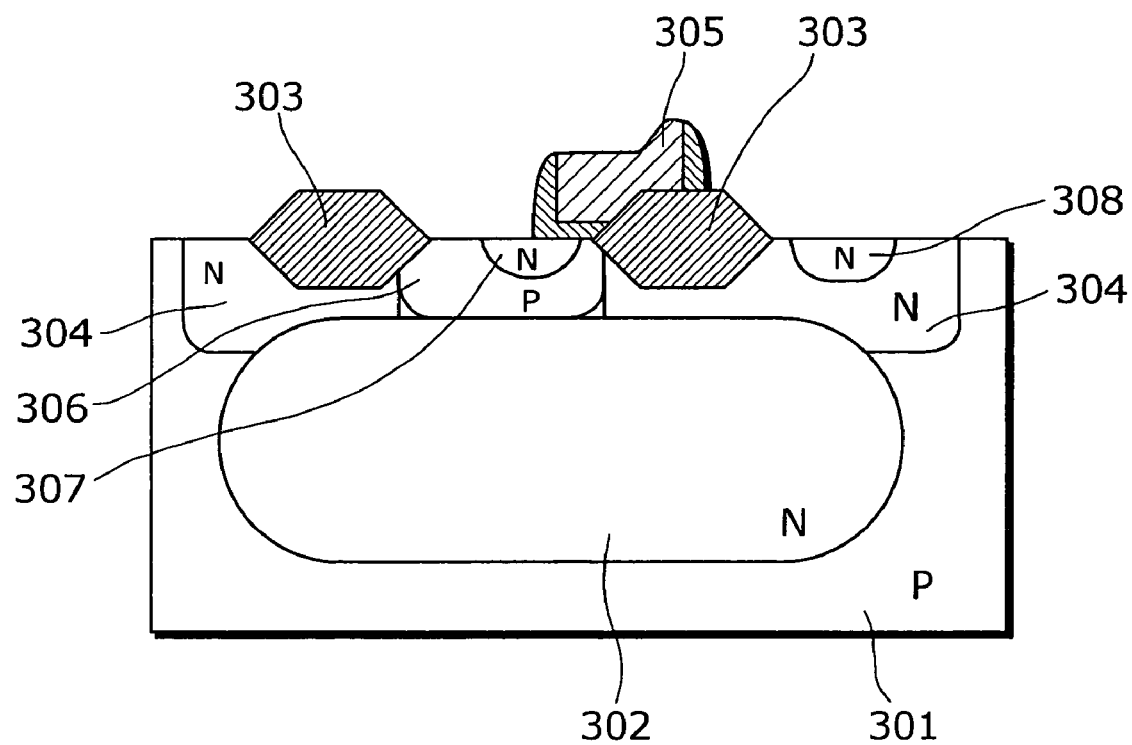
FIG. 16D is a cross-sectional diagram for explaining a method of manufacturing the DMOS transistor according to the fourth embodiment of the present invention.

Next, as shown in FIG. 16D, a P-type body layer 306 is formed on a portion in the P-type silicon substrate 301 on which the N-type well layer 304 is not formed, by self alignment that uses the gate electrode 305 as a mask, and then N-type source layer 307 is formed in such P-type body layer 306. Then, N-type drain contact layer 308 is formed on a portion, in the N-type well layer 304, that is distant from the gate electrode 305. Then, heat treatment is performed for about 30 minutes at a temperature of 900° C. in a nitrogen atmosphere, for example, so as to recover damages incurred by ion implantation. Here, a condition for formation of the P-type body layer 306 is set so that both sides of the P-type body layer 306 reach respective layers making up the N-type well layer 304.

Here, by controlling conditions for ion implantation and heat treatment that are performed during formation of the N-type buried layer 302 and LOCOS film 303, an upper end of the N-type buried layer 302 and a bottom end of the P-type body layer 306 are formed substantially in contact with each other. Note that it is also possible that the upper end of the N-type buried layer 302 and the bottom end of the P-type body layer 306 are formed substantially in contact with each other by controlling conditions for formation of the N-type buried layer 302, the LOCOS film 303, and the P-type body layer 306.

As described above, according to the DMOS transistor of the present embodiment, it is possible to provide an inexpensive DMOS transistor that has a parasitic diode, reduces on-resistance, and lowers an hfe of a parasitic PNP transistor, as in the case of the DMOS transistor of the first embodiment.

Moreover, according to the DMOS transistor of the present embodiment, it becomes possible to provide a DMOS transistor with excellent frequency properties, as in the case of the DMOS transistor of the third embodiment.

Furthermore, the DMOS transistor according to the present embodiment has a LOCOS offset structure. Since such DMOS transistor has an increased breakdown voltage compared with the DMOS transistor of the first embodiment, it is possible to provide a DMOS transistor that further increases a breakdown voltage.

Furthermore, according to the DMOS transistor of the present embodiment, the P-type body layer 306 and the N-type well layer 304 are formed by self alignment that uses the LOCOS film 303 and the gate electrode 305 as a mask. Accordingly, a distance between N-type well layer 304 and P-type body layer 306 varies depending only on misalignment of LOCOS film 303 and gate electrode 305 in a darkroom process. Meanwhile, when a DMOS transistor with LOCOS offset structure is formed using the DMOS transistor of the second embodiment, N-type well layer 304 is formed first, which is followed by sequential formation of LOCOS film 303, gate electrode 305, and P-type body layer 306. Therefore, a distance between the N-type well layer 304 and the P-type body layer 306 varies depending on misalignment of the N-type well layer 304 and the LOCOS film 303 in a darkroom process, and depending on misalignment of the LOCOS film 303 and the gate electrode 305 in a darkroom process. This makes it possible for the present embodiment to provide DMOS transistors with stable properties.

Furthermore, it is also possible to form a CMOS device and a DMOS transistor in the same P-type silicon substrate and to use a N-type well layer of a P-channel MOS that constitutes the CMOS device as the N-type well layer of the DMOS transistor. In this case, the N-type well layer of the P-channel MOS is formed simultaneously when the N-type well layer of the DMOS transistor is formed. Since this eliminates a necessity to form the N-type well layer of the DMOS transistor, it becomes possible to provide a further inexpensive DMOS transistor.

Although only some exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

For example, descriptions have been given in the above embodiments that a DMOS transistor is an N-channel MOS transistor, but the same effects can be achieved if a DMOS transistor is a P-channel MOS transistor, by changing a conductivity type of all elements to an opposite conductivity type.

What is claimed is:

1. A semiconductor device comprising:
a semiconductor substrate of a first conductivity type;
a well layer in said semiconductor substrate, said well layer being of a second conductivity type that is opposite to the first conductivity type;
a drain contact layer of the second conductivity type in said well layer;
a body layer of the first conductivity type in said semiconductor substrate;
a source layer of the second conductivity type in said body layer;
a buried layer of the second conductivity type in said semiconductor substrate and below said body layer; and
a gate electrode above said semiconductor substrate,
wherein said source layer is separated from said drain contact layer,
wherein an upper end of said buried layer is in direct contact with a bottom end of said body layer,
wherein said body layer is spaced apart from said drain contact layer such that a region is provided between said body layer and said drain contact layer,
wherein impurities of the second conductivity type are provided in an entirety of said region between said body layer and said drain contact layer such that impurities of the first conductivity type are not included in a portion from an upper surface of said well layer to said buried layer between said body layer and said drain contact layer, and
wherein said upper end of said buried layer is in direct physical contact with an entire bottom surface of said body layer such that there is no intervening layer between said buried layer and said body layer in an area of contact.

2. The semiconductor device according to claim 1, further comprising: a local oxidation of silicon film on a portion of said semiconductor substrate on which said body layer is not located,
wherein said local oxidation of silicon film includes a first portion and a second portion that are separated from one another by a predetermined spacing,
wherein said gate electrode is on said first portion of said local oxidation of silicon film, and extends laterally of said first portion, and
wherein said well layer is disposed beneath said local oxidation of silicon film, said well layer having at least a portion extending laterally from said first portion of said local oxidation of silicon film.

3. The semiconductor device according to claim 1, wherein an impurity concentration of the second conductivity type of said buried layer is higher than an impurity concentration of the second conductivity type of said well layer.

4. The semiconductor device according to claim 1, wherein said well layer comprises a first portion and a second portion which are arranged to define a space therebetween, said body layer being disposed within said space.

5. The semiconductor device according to claim 2, wherein said well layer comprises a first portion and a second portion which are arranged so as to define a space therebetween,
 wherein said body layer is disposed within said space,
 wherein said first portion of said well layer extends laterally from said first portion of said local oxidation of silicon film, and
 wherein said second portion of said well layer extends laterally from said second portion of said local oxidation of silicon film, such that said well layer does not overlap with said predetermined spacing separating said first portion of said local oxidation of silicon film and said second portion of said local oxidation of said silicon film.

6. The semiconductor device according to claim 1, wherein an impurity concentration of the first conductivity type of said body layer changes to an impurity concentration of the second conductivity type of said buried layer in a portion in which a bottom end of said body layer contacts an upper end of said buried layer.

7. The semiconductor device according to claim 1, wherein a point at which said body layer contacts said buried layer is located at substantially the same height from a bottom of said semiconductor device as a point at which an upper surface of said buried layer contacts said well layer.

8. The semiconductor device according to claim 1, wherein a distance between an upper surface of said well layer and a point at which said well layer contacts said buried layer is shorter than a length of said gate electrode.

9. The semiconductor device according to claim 1, wherein a portion of said well layer is located above said buried layer, and
 wherein said buried layer has an impurity concentration of the second conductivity type which is higher than an impurity concentration of the second conductivity type of said portion of said well layer located above said buried layer.

10. The semiconductor device according to claim 1, wherein an insulating sidewall is disposed in each of a left portion and a right portion of said gate electrode.

11. The semiconductor device according to claim 1, wherein said well layer includes a first portion and a second portion separated from said first portion,
 wherein said body layer is disposed between said first portion and said second portion,
 wherein said gate electrode is disposed on said second portion and is not disposed on said first portion.

12. The semiconductor device according to claim 1, wherein said body layer has a portion in which an impurity of the second conductivity type is not present.

13. The semiconductor device according to claim 1, further comprising:
 a current input wire disposed on said drain contact layer; and
 a current output wire disposed on said source layer,
 wherein said drain layer, said well layer, and said buried layer are configured such that a current flowing from said current input wire flows through said drain contact layer and source layer to said current output wire in a first route through said well layer and said body layer and also in a second route through said well layer, said buried layer, and said body layer.

14. The semiconductor device according to claim 1, wherein said drain layer, said well layer, and said buried layer are configured such that a current flowing from said drain contact layer to said source layer flows in a first route through said well layer and said body layer and also in a second route through said well layer, said buried layer, and said body layer.

15. The semiconductor device according to claim 1, wherein each of said well layer and said semiconductor substrate is in direct physical contact with said buried layer.

16. The semiconductor device according to claim 1, further comprising:
 a first metal wire contacting said drain contact layer for providing a current to said drain contact layer; and
 a second metal wire contacting said body layer and said source layer for drawing current from said source layer.

17. A semiconductor device comprising:
 a semiconductor substrate of a first conductivity type;
 a well layer in said semiconductor substrate, said well layer being of a second conductivity type that is opposite to the first conductivity type;
 a drain contact layer of the second conductivity type in said well layer;
 a body layer of the first conductivity type in said semiconductor substrate;
 a source layer of the second conductivity type in said body layer;
 a buried layer of the second conductivity type in said semiconductor substrate and below said body layer;
 a gate electrode above said semiconductor substrate;
 a current input wire disposed on said drain contact layer; and
 a current output wire disposed on said source layer,
 wherein said source layer is separated from said drain contact layer,
 wherein an upper end of said buried layer is in direct contact with an entire bottom surface of said body layer such that there is no intervening layer between said buried layer and said body layer in an area of contact,
 wherein said body layer is spaced apart from said drain contact layer such that a region is provided between said body layer and said drain contact layer,
 wherein impurities of the second conductivity type are provided in an entirety of said region between said body layer and said drain contact layer such that impurities of the first conductivity type are not included in a portion from an upper surface of said well layer to said buried layer between said body layer and said drain contact layer,
 wherein said drain layer, said well layer, and said buried layer are configured such that a current flowing from said current input wire flows through said drain contact layer and source layer to said current output wire in a first route through said well layer and said body layer and also in a second route through said well layer, said buried layer, and said body layer.

18. A semiconductor device comprising:
 a semiconductor substrate of a first conductivity type;
 a well layer in said semiconductor substrate, said well layer being of a second conductivity type that is opposite to the first conductivity type;
 a drain contact layer of the second conductivity type in said well layer;
 a body layer of the first conductivity type in said semiconductor substrate;
 a source layer of the second conductivity type in said body layer;
 a buried layer of the second conductivity type in said semiconductor substrate and below said body layer;
 a gate electrode above said semiconductor substrate;
 a current input wire disposed on said drain contact layer; and a current output wire disposed on said source layer, wherein said source layer is separated from said drain contact layer, wherein an upper end of said buried layer is in direct contact with an entire bottom surface of said body layer such that there is no intervening layer between said buried layer and said body layer in an area of contact, wherein each of said well layer and said semiconductor substrate is in direct physical contact with said buried layer, wherein said well layer includes a first portion and a second portion separated from said first portion, said body layer being disposed between said first portion and said second portion, and said gate electrode being disposed on said second portion and is not disposed on said first portion, wherein a portion of said well layer is located above said buried layer, and said buried layer has an impurity concentration of the second conductivity type which is higher than an impurity concentration of the second conductivity type of said portion of said well layer located above said buried layer, wherein said body layer is spaced apart from said drain contact layer such that a region is provided between said body layer and said drain contact layer, wherein impurities of the second conductivity type are provided in an entirety of said region between said body layer and said drain contact layer such that impurities of the first conductivity type are not included in a portion from an upper surface of said well layer to of said buried layer between said body layer and said drain contact layer, wherein said drain layer, said well layer, and said buried layer are configured such that a current flowing from said current input wire flows through said drain contact layer and source layer to said current output wire in a first route through said well layer and said body layer and also in a second route through said well layer, said buried layer, and said body layer.

* * * * *

UNITED STATES PATENT AND TRADEMARK OFFICE
CERTIFICATE OF CORRECTION

Page 1 of 1

PATENT NO. : 7,851,883 B2
APPLICATION NO. : 11/075895
DATED : December 14, 2010
INVENTOR(S) : Masaki Inoue et al.

It is certified that error appears in the above-identified patent and that said Letters Patent is hereby corrected as shown below:

In the Claims

In column 18, claim 1, line 25, "agate" should read --a gate--.

Signed and Sealed this
Fifteenth Day of March, 2011

David J. Kappos
*Director of the United States Patent and Trademark Office*